US012719015B2

(12) United States Patent
Mueller et al.

(10) Patent No.: US 12,719,015 B2
(45) Date of Patent: Aug. 25, 2026

(54) METHOD FOR OPERATING A MULTI-BEAM PARTICLE MICROSCOPE WITH FAST CLOSED-LOOP BEAM CURRENT CONTROL, COMPUTER PROGRAM PRODUCT AND MULTI-BEAM PARTICLE MICROSCOPE

(71) Applicant: Carl Zeiss MultiSEM GmbH, Oberkochen (DE)

(72) Inventors: Ingo Mueller, Aalen (DE); Nicolas Kaufmann, Aalen (DE); Michael Behnke, Eislingen (DE); Hans Fritz, Grabs (CH)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 359 days.

(21) Appl. No.: 18/393,170

(22) Filed: Dec. 21, 2023

(65) Prior Publication Data

US 2024/0128048 A1 Apr. 18, 2024

Related U.S. Application Data

(63) Continuation of application No. PCT/EP2022/025312, filed on Jul. 6, 2022.

(30) Foreign Application Priority Data

Jul. 19, 2021 (DE) ..................... 10 2021 118 561.0

(51) Int. Cl.
*H01J 37/24* (2006.01)
*H01J 37/10* (2006.01)
(Continued)

(52) U.S. Cl.
CPC ............ *H01J 37/243* (2013.01); *H01J 37/10* (2013.01); *H01J 37/12* (2013.01); *H01J 37/244* (2013.01);
(Continued)

(58) Field of Classification Search
CPC .......... H01J 37/243; H01J 37/10; H01J 37/12; H01J 37/244; H01J 37/261; H01J 2237/0435; H01J 2237/24564
See application file for complete search history.

(56) References Cited

U.S. PATENT DOCUMENTS 4,130,761 A 12/1978 Matsuda
4,153,843 A 5/1979 Pease
(Continued)

FOREIGN PATENT DOCUMENTS

DE 600 34 559 T2 1/2008
DE 10 2013 014 976 A1 3/2015
(Continued)

OTHER PUBLICATIONS

International Search Report and Written Opinion for corresponding PCT Appl No. PCT/EP2022/025312, dated Dec. 21, 2022.
(Continued)

*Primary Examiner* — Nicole M Ippolito
(74) *Attorney, Agent, or Firm* — Fish & Richardson P.C.

(57) ABSTRACT

A method for operating a multi-beam particle microscope which operates using a plurality of individual charged particle beams, wherein the method includes the following steps: measuring the beam current; determining a deviation of the measured beam current from a nominal beam current; decomposing the determined deviation into a drift component and into a high-frequency component; and controlling the high-frequency component of the beam current via a first closed-loop beam current control mechanism and/or compensating an effect of the high-frequency component on a recording quality of the multi-beam particle microscope using different mechanism than a closed-loop beam current control mechanism. An electrostatic control lens arranged in the beam generating system between extractor and anode can be used as first closed-loop beam current control mecha-
(Continued)

nism. Adapting an extractor voltage of the beam generating system can be avoided.

21 Claims, 10 Drawing Sheets

(51) Int. Cl.
*H01J 37/12* (2006.01)
*H01J 37/244* (2006.01)
*H01J 37/26* (2006.01)

(52) U.S. Cl.
CPC ..... *H01J 37/261* (2013.01); *H01J 2237/0435* (2013.01); *H01J 2237/24564* (2013.01)

(56) References Cited

U.S. PATENT DOCUMENTS 4,200,794 A 4/1980 Newberry
4,338,548 A 7/1982 Bono
4,742,234 A 5/1988 Feldman
5,111,053 A 5/1992 Suzuki
5,215,623 A 6/1993 Takahashi
5,864,142 A 1/1999 Muraki
5,892,224 A 4/1999 Nakasuji
5,905,267 A 5/1999 Muraki
5,981,954 A 11/1999 Muraki
6,107,636 A 8/2000 Muraki
6,124,599 A 9/2000 Muraki
6,137,113 A 10/2000 Muraki
6,214,498 B1 4/2001 Choi
6,323,499 B1 11/2001 Muraki
6,333,508 B1 12/2001 Katsap
6,617,587 B2 9/2003 Parker et al.
6,617,595 B1 9/2003 Okunuki
6,633,366 B2 10/2003 De Jager
6,696,371 B2 2/2004 Butschke
6,787,780 B2 9/2004 Hamaguchi
6,804,288 B2 10/2004 Haraguchi
6,818,911 B2 11/2004 Tamamori
6,835,508 B2 12/2004 Butschke
6,872,950 B2 3/2005 Shimada
6,903,345 B2 6/2005 Ono
6,903,353 B2 6/2005 Muraki
6,917,045 B2 7/2005 Hashimoto
6,919,574 B2 7/2005 Hashimoto
6,943,349 B2 9/2005 Adamec
6,953,938 B2 10/2005 Iwasaki
6,969,862 B2 11/2005 Muraki et al.
6,992,290 B2 1/2006 Watanabe
7,005,658 B2 2/2006 Muraki
7,015,467 B2 3/2006 Maldonado
7,060,984 B2 6/2006 Nagae
7,084,411 B2 8/2006 Lammer-Pachlinger
7,091,486 B1 8/2006 McCord et al.
7,091,504 B2 8/2006 Wieland
7,109,494 B2 9/2006 Ono
7,126,141 B2 10/2006 Ono
7,129,502 B2 10/2006 Kruit
7,244,949 B2 7/2007 Knippelmeyer et al.
7,285,779 B2 10/2007 Litman
7,332,730 B2 2/2008 Heinitz et al.
7,375,326 B2 5/2008 Sender
7,388,214 B2 6/2008 Maede
7,420,164 B2 9/2008 Nakasuji
7,468,507 B2 12/2008 Rogers
7,504,622 B2 3/2009 Elyasaf
7,535,001 B2 5/2009 Sender
7,601,972 B2 10/2009 Nakasuji
7,619,203 B2 11/2009 Elyasaf
7,696,497 B2 4/2010 Rogers
8,035,082 B2 10/2011 Yamazaki
8,134,135 B2 3/2012 Kruit
8,350,214 B2 1/2013 Otaki
8,362,425 B2 1/2013 Han
8,384,051 B2 2/2013 Ozawa
8,598,525 B2 12/2013 Zeidler
8,618,496 B2 12/2013 Wieland
8,704,192 B2 4/2014 Sano
8,748,842 B2 6/2014 Ohashi
8,779,399 B2 7/2014 Yamanaka
8,829,465 B2 9/2014 Tsunoda
8,963,099 B2 2/2015 Yamada
9,153,413 B2 10/2015 Almogy
9,263,233 B2 2/2016 Zeidler
9,336,981 B2 5/2016 Knippelmeyer
9,336,982 B2 5/2016 Zeidler
9,349,571 B2 5/2016 Kemen
9,368,314 B2 6/2016 Nakasuji
9,530,613 B2 12/2016 Rogers
9,536,702 B2 1/2017 Lang
9,607,805 B2 3/2017 Liu
9,653,254 B2 5/2017 Zeidler
9,702,983 B2 7/2017 Eder
9,922,799 B2 3/2018 Li
9,991,089 B2 6/2018 Mueller
10,062,541 B2 8/2018 Ren
10,141,160 B2 11/2018 Ren
10,354,831 B2 7/2019 Kemen
10,388,487 B2 8/2019 Zeidler
10,535,494 B2 1/2020 Zeidler
10,541,112 B2 1/2020 Schubert
10,586,677 B1 3/2020 Okada
10,600,613 B2 3/2020 Zeidler
10,622,184 B2 4/2020 Knippelmeyer
10,643,820 B2 5/2020 Ren
10,741,355 B1 8/2020 Zeidler
10,811,215 B2 10/2020 Zeidler
10,854,423 B2 12/2020 Sarov
10,879,031 B2 12/2020 Ren
10,896,800 B2 1/2021 Riedesel
2002/0142496 A1* 10/2002 Nakasuji ............ G01N 23/2251
250/492.3
2004/0135102 A1 7/2004 Muraki et al.
2009/0014649 A1 1/2009 Nakasuji
2010/0181479 A1 7/2010 Knippelmeyer et al.
2014/0151570 A1 6/2014 Kato et al.
2014/0197325 A1 7/2014 Kato
2017/0133198 A1 5/2017 Kruit
2019/0333732 A1 10/2019 Ren
2019/0355544 A1 11/2019 Riedesel et al.
2020/0211810 A1 7/2020 Zeidler
2020/0243300 A1 7/2020 Zeidler
2020/0312619 A1* 10/2020 Mangnus ............. H01J 37/244
2020/0373116 A1 11/2020 Zeidler
2021/0005423 A1 1/2021 Zeidler
2021/0035773 A1 2/2021 Zeidler
2021/0192700 A1 6/2021 Zeidler et al.
2021/0210303 A1 7/2021 Zeidler et al.
2021/0210306 A1 7/2021 Zeidler et al.
2021/0217577 A1 7/2021 Zeidler et al.
2022/0102104 A1 3/2022 Fritz et al.
2023/0043036 A1 2/2023 Zeidler et al.
2024/0203687 A1 6/2024 Storeck et al.

FOREIGN PATENT DOCUMENTS

DE 10 2013 016 113 A1 3/2015
DE 10 2018 007 455 A1 3/2020
DE 10 2018 007 652 A1 4/2020
DE 10 2019 008 249 B3 11/2020
EP 2 088 614 A1 8/2009
GB 2519511 A 4/2015
GB 2521819 A 7/2015
JP 59184524 A 10/1984
JP 60042825 A 3/1985
JP 60105229 A 6/1985
JP 61263217 A 11/1986
JP 2014229481 A 12/2014
KR 10-2006-0093324 A 8/2006
TW 201824329 A 7/2018
WO WO 2005/024881 A2 3/2005
WO WO 2007/028595 A2 3/2007
WO WO 2007/028596 A1 3/2007

(56) References Cited

FOREIGN PATENT DOCUMENTS

| | | | |
|---|---|---|---|
| WO | WO 2007/060017 | A2 | 5/2007 |
| WO | WO2013032949 | A1 | 3/2013 |
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |
| WO | WO 2021/018332 | A1 | 2/2021 |
| WO | WO 2021/078352 | A1 | 4/2021 |

OTHER PUBLICATIONS

Netherlands Search Report, with translation thereof, for corresponding NL Appl No. 2032542, dated May 19, 2023.
Taiwanese Office Action, with translation thereof, for corresponding TW Appl 111124702, dated Apr. 19, 2023.
L.H. Veneklasen et al., *Oxygen-Processed Field Emission Source*, Journal of Applied Physics 43 (1972), p. 1600-1604.
U.S. Appl. No. 18/405,813, filed Jan. 5, 2024, Gero Storeck.

* cited by examiner

METHOD FOR OPERATING A MULTI-BEAM PARTICLE MICROSCOPE WITH FAST CLOSED-LOOP BEAM CURRENT CONTROL, COMPUTER PROGRAM PRODUCT AND MULTI-BEAM PARTICLE MICROSCOPE

CROSS-REFERENCE TO RELATED APPLICATIONS

The present application is a continuation of, and claims benefit under 35 USC 120 to, international application PCT/EP2022/025312, filed Jul. 6, 2022, which claims benefit under 35 USC 119 of German Application No PCT/EP2022/025312, filed Jul. 19, 2021. The entire disclosure of each these applications is incorporated by reference herein.

FIELD

In general, the disclosure relates to multi-beam particle microscopes which operate using a plurality of individual particle beams. For example, the disclosure relates to a method for closed-loop beam current control in a multi-beam particle microscope, an associated computer program product, and an associated multi-beam particle microscope.

BACKGROUND

With the continuous development of ever smaller and ever more complex microstructures such as semiconductor components, it can be desirable to develop and optimize planar production techniques and inspection systems for producing and inspecting small dimensions of the microstructures. By way of example, the development and production of the semiconductor components typically involves monitoring of the design of test wafers, and the planar production techniques can involve a process optimization for a reliable production with a high throughput. Moreover, there have been recent demands for an analysis of semiconductor wafers for reverse engineering and for a customer-specific, individual configuration of semiconductor components. Therefore, there can be a desire for an inspection apparatus which can be used with a high throughput for examining the microstructures on wafers with a great accuracy.

Typical silicon wafers used in the production of semiconductor components have diameters of up to 300 mm Each wafer is usually subdivided into 30 to 60 repeating regions ("dies") with a size of up to 800 $mm^2$. A semiconductor apparatus comprises a plurality of semiconductor structures, which are produced in layers on a surface of the wafer by planar integration techniques. Semiconductor wafers typically have a plane surface on account of the production processes. The structure sizes of the integrated semiconductor structures in this case can extend from a few lam to the critical dimensions (CD) of 5 nm, wherein the structure dimensions will become even smaller in the near future; in future, structure sizes or critical dimensions (CD) are expected to be less than 3 nm, for example 2 nm, or even under 1 nm. In the case of the aforementioned small structure sizes, it can be desirable to quickly identify defects of the size of the critical dimensions in a very large area. For several applications, the specification requirements on the accuracy of a measurement provided by an inspection device are even higher, for example by a factor of two or one order of magnitude. By way of example, a width of a semiconductor feature is to be measured with an accuracy of below 1 nm, for example 0.3 nm or even less, and a relative position of semiconductor structures is to be determined with a superposition accuracy of below 1 nm, for example 0.3 nm or even less.

The MSEM, a multi-beam scanning electron microscope, is a relatively new development in the field of charged particle systems (charged particle microscopes, CPMs). By way of example, a multi-beam scanning electron microscope is disclosed in U.S. Pat. No. 7,244,949 B2 and in US 2019/0355544 A1. In the case of a multi-beam electron microscope or MSEM, a sample is irradiated simultaneously with a plurality of individual electron beams, which are arranged in a field or raster. By way of example, 4 to 10,000 individual electron beams can be provided as primary radiation, with each individual electron beam being separated from an adjacent individual electron beam by a pitch of 1 to 200 micrometers. By way of example, an MSEM has approximately 100 separated individual electron beams ("beamlets"), which for example are arranged in a hexagonal raster, with the individual electron beams being separated by a distance of approximately 10 μm. The plurality of charged individual particle beams (primary beams) are focused, individually in each case, on a surface of a sample to be examined by way of common large-field optics including, inter alia, a common objective lens. By way of example, the sample can be a semiconductor wafer which is fastened to a wafer holder that is assembled on a movable stage. During the illumination of the wafer surface with the charged primary individual particle beams, interaction products, for example secondary electrons or backscattered electrons, emanate from the surface of the wafer. Their respective start points correspond to those locations on the sample on which the plurality of primary individual particle beams are focused in each case. The amount and the energy of the interaction products can depend inter alia on the material composition and the topography of the wafer surface. The interaction products form a plurality of secondary individual particle beams (secondary beams), which are collected by the common objective lens and which are incident on a detector arranged in a detection plane as a result of a projection imaging system of the multi-beam inspection system. The detector comprises a plurality of detection regions, each of which comprises a plurality of detection pixels, and the detector captures an intensity distribution for each of the secondary individual particle beams. An image field of for example 100 μm×100 μm is obtained in the process.

Certain known multi-beam electron microscopes comprise a sequence of electrostatic and magnetic elements. At least some of the electrostatic and magnetic elements are adjustable in order to adapt the focus position and the stigmation of the plurality of charged individual particle beams. Certain known multi-beam systems with charged particles moreover comprise at least one cross-over plane of the primary or the secondary charged individual particle beams. Moreover, these known systems can comprise detection systems to make the adjustment easier. Such multi-beam particle microscopes can comprise at least one beam deflector ("deflection scanner") for collective scanning of a region of the sample surface via the plurality of primary individual beams in order to obtain an image field of the sample surface. Further details regarding a multi-beam electron microscope and a method for operating same are described, for example, in the German patent application with the application number 102020206739.2, filed on May 28, 2020, the disclosure of which is incorporated in full in this patent application by reference.

As the demands on the imaging quality increase, in general, so do the demands on the multi-beam particle microscope used for imaging. Stable operating parameters are to be considered for high-quality recordings. One of these is the beam current intensity of the individual particle beams used to scan a sample surface.

For a uniform beam current intensity of the individual particle beams, the emission characteristic of the particle beam source is to be considered, more precisely a uniformity of the emission characteristic over the entire utilized emission angle. When using relatively large emission angles, the emission characteristic of particle sources, e.g., of thermal field emission (TFE) sources, is generally no longer uniform throughout. Accordingly, the irradiance at a first multi-aperture plate in a corresponding particle beam system is also generally no longer uniform throughout and there are relatively large variations in the current densities in different individual beams. However, in the case of multi-particle inspection systems, it is a desired property of the system that there is only a small variation in the current intensities between the various individual beams, which is typically less than a few percent or even less than one percent, so that all individual image fields of the multi-image field are scanned with an equivalent number of particles or electrons. By way of example, this is a precondition to obtain individual images with approximately the same brightness. The obtainable resolution of the individual images also depends on the individual beam current.

There are options for an individual adjustment of the beam current for individual particle beams. One option in this respect is disclosed by DE 10 2018 007 652 A1, the disclosure of which is incorporated in this patent application in full by reference.

The emission characteristic of the particle source also can change slowly over time; it may exhibit a drift behavior. By way of example, a particle beam originally emitted by the source may change its direction. The use of particle optical components for correcting or compensating this slow change in direction is known.

Moreover, a particle source or tip may age; by way of example, it may lose brightness. The brightness of the images, in turn, generally correlates with the brightness or luminance of the source. If the source loses brightness, this usually also applies to the image brightness. One solution to this issue is increasing the gain of the detection system in order to compensate the reduced brightness. However, this can change the signal-to-noise ratio (SNR) at the detector, which can lead to a reduction in the signal-to-noise ratio and the obtainable contrast in the images is reduced, and so this solution only has conditional suitability.

Therefore, an adjustment of the beam generating system itself is conventional, with a voltage applied to an extractor electrode being altered in a known manner. However, it may take several days following such a change in the extractor current for the newly adjusted beam generating system to once again exhibit a sufficiently constant emission characteristic; the tips first "burns in" again.

In summary, it is known that slow changes in the emission characteristic of a source can be compensated by closed-loop control, but that fast or high-frequency changes cannot.

US 2020/0312619 A1 discloses a correction of beam parameters in a multi-beam particle microscope on the basis of the beam current measurements at a multi-aperture array. In this case, the beam generating system is controlled by adjusting the extractor voltage or the acceleration voltage. A beam migration can also be avoided. However, this always relates to slow corrections of an arising drift.

L. H. Veneklasen et al., "Oxygen-Processed Field Emission Source", Journal of Applied Physics 43 (1972), S. 1600-1604 discloses a specific tip and investigates its energy spread and flicker noise.

DE 10 2019 008 249 B3 discloses a particle beam system comprising a multi-beam deflection device and a beam stop, a method for operating the particle beam system and an associated computer program product. The beam stop is arranged in the first particle-optical beam path level with a site at which a particle beam diameter is reduced or is at a minimum and can be used to measure an overall beam current. It can be embodied as a specific cup.

DE 600 34 559 T2 discloses a multi-electron-beam lithography apparatus with mutually different beam limiting apertures.

EP 2 088 614 A1 discloses a beam current calibration system for a single beam particle microscope using either the standard detector itself for the beam current measurement or using additionally provided detection elements on or near the detector. Flashing for removing debris from a tip is addressed, so is a standard compensation of thus occurring current changes by changing the extractor voltage or the suppressor voltage.

SUMMARY

The disclosure seeks to provide an improved method for closed-loop beam current control in a multi-beam particle microscope. For example the method can facilitate fast or high-frequency corrections. In this case, it can be desirable to avoid a quick readjustment of the extractor current.

According to a first aspect of the disclosure, the latter relates to a method for operating a multi-beam particle microscope which operates using a plurality of individual charged particle beams, the method including the following steps: measuring the beam current; determining a deviation of the measured beam current from a nominal beam current; decomposing the determined deviation into a drift component and into a high-frequency component; and controlling the high-frequency component of the beam current via a first closed-loop beam current control mechanism and/or compensating an effect of the high-frequency component on a recording quality of the multi-beam particle microscope using a different mechanism than a closed-loop beam current control mechanism. The drift component of the beam current can optionally be controlled via a second closed-loop beam current control mechanism.

The individual charged particle beams can be, e.g., electrons, positrons, muons or ions or other charged particles.

According to the disclosure, the beam current can be measured and a deviation of the measured beam current from a nominal beam current can be determined. The nominal beam current is known or specified. In this case, this may relate to the nominal overall beam current of all individual particle beams together, but this may also relate to a respective nominal beam current of individual particle beams or to a nominal beam current of a certain portion of a beam cone. Optionally, a nominal beam current is defined in such a way that the beam current overall (overall beam current) does not drop below a minimum value. Moreover, it is optionally the case that each individual particle beam does not drop below at least one predefined value of the beam current. It is also possible to define respective admissible maximum values for a nominal beam current (individual beam current and/or overall beam current). In general, the more comprehensively the beam current is measured (individual beam current, specific section(s) of a beam spot, current on a defined area at a defined location and/or overall beam current) or as more comprehensive data for the beam current becomes available, the more precisely the determined deviation of the beam current from the nominal beam current can be decomposed into a drift component and into a high-frequency component. Methods or algorithms known per se from mathematics can be used for the decomposition; by way of example, an associated program code may be integrated into the controller of the multi-beam particle microscope.

Normally, a drift component of the beam current changes continuously over time; the drift component usually has no sudden jumps or changes. In this case, the drift component of the beam current only changes slowly (with a low frequency or quasi-statically) over a relatively long period of time, for example over several days, weeks or even months. By way of example, reference can be made to drift if slow changes can be seen (naturally fast changes could additionally also be seen here) in the profile of the current measured over the entire image recording time, for example during the continuous operational time for recording a sample, optionally even with interruptions.

The image recording may also be interrupted for a relatively long period of time (e.g., deactivation of the tip at night or during maintenance work) and the beam current may have a different starting point following reactivation, e.g., at the next day, but may then have a slow trend over time again.

By contrast, the high-frequency component of the beam current deviation from the nominal beam current changes comparatively quickly, for example within minutes or hours and, for example, during an ongoing measurement using the multi-beam particle microscope (e.g., while a "frame" is measured, that is to say during an image recording, within the scope of which the secondary electrons per individual beam are detected over a certain integration time and are used as intensity signal). By way of example, fast, high-frequency changes may occur during the image recording time for an individual recording (in that case, an individual recording consists of a complete set of multi-beam images), or during the image recording time for a region consisting of a plurality of individual recordings. A high-frequency deviation intermittently exceeding and intermittently dropping below the nominal value for the beam current is typical for the high-frequency component. Optionally, a minimum value for the beam current is nevertheless not undershot in the process, the variation instead being around a mean value. The high-frequency changes in the beam current—in comparison with the drift component—occur comparatively quickly; by way of example, they are faster than the low-frequency changes on account of drift by a factor of at least 500 or 1000 or even 10000.

According to the disclosure the high-frequency component of the beam current can be controlled via a first closed-loop beam current control mechanism and/or an effect of the high-frequency component on the recording quality of the multi-beam particle microscope can be compensated using a different mechanism to a closed-loop beam current control mechanism. However, the high-frequency variation in the beam current can be compensated in both cases. In the first case, this is implemented by the closed-loop beam current control mechanism and true closed-loop control of the high-frequency component of the beam current and, in the second case, this is alternatively implemented by compensating the negative effects of the high-frequency beam current variation. There are a number of implementation options for both cases, at least some of these are discussed in detail below.

Optionally, the drift component of the beam current, too, may be controlled via a second closed-loop beam current control mechanism. In this case, both the first closed-loop beam current control mechanism and the second closed-loop beam current control mechanism may be provided in one part or in many parts. Optionally, the first closed-loop beam current control mechanism differs from the second closed-loop beam current control mechanism but the first and the second closed-loop beam current control mechanism may also be identical. What should be observed in this case is that high-frequency and fast closed-loop control of the beam current usually involves different technical mechanisms to a slow closed-loop beam current control. In general, the mechanism previously used can allow the correction of a drift component but do not allow the correction of a high-frequency component. Conversely, high-frequency corrections may in general also be carried out more slowly such that the drift component of a beam current would likewise be correctable or controllable via certain technical mechanisms. Within the scope of this patent application, the term "closed-loop control" is used in the conventional sense of control engineering, that is to say the functional concept is the negative feedback of the measured current value on the input of a closed-loop control device that controls the current value, of the controller or, in this case, of the closed-loop beam current control mechanism.

According to an embodiment of the disclosure, measuring the beam current comprises the measurement of an overall beam current of the individual particle beams during an image recording procedure. Measurement of the beam currents of the individual particle beams is conventional in the case of a multi-beam particle microscope, for example by using a Faraday cup or an array of Faraday cups, this measuring device being introduced into the object plane instead of the sample. However, this measuring process is implemented outside of an image recording procedure and is comparatively slow; it often takes more than half an hour for each measuring procedure. However, according to the disclosure, the beam current is now measured as overall beam current during an image recording procedure. This means it is measured during an ongoing recording. By way of example, during a line jump within the scope of an image recording or during an image change (change from one multi-image field to the next multi-image field), the totality of the individual particle beams may be deflected or blanked via a multi-beam deflection device and directed at a beam stop with a beam current measuring mechanism. By way of example, such a beam stop in the form of a rotationally symmetric cup may be arranged in front of the objective lens, level with a cross-over plane, in the particle optical beam path of the multi-beam particle microscope. A beam current measuring mechanism may be integrated or connected therein. Details in this respect can be gathered from the German patent DE 10 2019 008 249 B3 by the applicant, the disclosure of which is incorporated into this patent application in full by reference.

According to an embodiment of the disclosure, measuring the beam current comprises a current measurement at a multi-aperture array at selected positions during an image recording procedure. Thus, there is no need to interrupt an image recording procedure in this style of measurement either; instead, as it were, the beam current can be measured on the side. The multi-aperture array can be an array arranged as a first multi-aperture array downstream of a condenser lens system in the particle optical beam path of a multi-beam particle microscope. This multi-aperture array can be the array which divides a first charged particle beam into a plurality of individual charged particle beams. In this case, the multi-aperture array can be a constituent part of what is known as the micro-optics, which can consist of or comprises a sequence of a plurality of multi-aperture plates or multi-aperture arrays. For a good image quality in this context, it is desirable for the first charged particle beam that emanates from a particle source or a tip to be incident uniformly on the multi-aperture array as perpendicularly as possible, in particular, and also to illuminate the latter as uniformly or as centered as possible. Then, it is possible to ensure that the beam current of the individual particle beams that pass through the multi-aperture array is sufficiently uniform in the individual particle beams. A uniform illumination can be achieved not only in the case of a telecentric incidence of the first charged particle beam on the multi-aperture array but also in the case of a divergent or convergent incidence, and in any case whenever the central beam axis is aligned perpendicular to the surface of the multi-aperture array. Here, the openings in the multi-aperture array can be circular but may have any other shape as well. The openings in the multi-aperture array can have a regular arrangement, for example a rectangular, square or hexagonal arrangement. $3n(n-1)+1$ openings can be provided in the case of a hexagonal arrangement, where n is any natural number.

Carrying out a current measurement at the multi-aperture array generally involves the use of a sensor system, with the latter being able to have different realizations. In this case, individual sensors may be assigned to the openings in the multi-aperture plate or array, but this is not mandatory. An approach is to arrange the sensor system for measuring the beam current around the openings in the multi-aperture array overall. In this way, the creation of the individual particle beams is not impeded but valuable information about the beam current may nevertheless be obtained. According to an embodiment of the disclosure, the multi-aperture array has on its upper side a grounded metal layer which absorbs and discharges excess electrons. One or more respectively grounded sensors that measure the incident electron current at the position of the respective sensor may be arranged above this metal layer. It is also possible to structure the metal layer itself and to measure the beam current segment-by-segment or with spatial resolution on the basis of this structuring. This measuring system may be calibrated, for example by virtue of the individual particle beams being measured using a displaceable stage and, for example, a Faraday cup thereon. Other embodiment variants and calibration methods are also conceivable.

According to an embodiment of the disclosure, three sensors for measuring the current are arranged on the upper side of the multi-aperture array, for example in the form of a triangle, such as in the form of an equilateral triangle, around the outside of the plurality of apertures. The three sensors can be exactly three sensors or else at least three sensors. In the case of a skillful arrangement or geometry of the arrangement, three sensors are sufficient to allow conclusions to be drawn about the beam current and also about the position of the illuminating beam cone which is incident on the multi-aperture array.

According to an embodiment of the disclosure, the method furthermore includes the following step: determining a radius and/or a displacement of the beam cone incident on the multi-aperture array. The optical axis of the incident beam cone corresponds to the midpoint of the multi-aperture array in the case of a uniform and central illumination of the multi-aperture array; the optical axis of the multi-beam particle microscope normally also passes through this midpoint. In this case, the beam current is normally distributed in rotationally symmetric fashion within the beam cone, that is to say there is a gradient in the radial direction such that sensors should also measure the same beam current in the case of a rotationally symmetric arrangement of these sensors around the optical axis or the midpoint of the multi-aperture array. By contrast, if the axis of the incident beam cone is displaced in relation to the center of the optical axis or in relation to the midpoint of the multi-aperture array, then different beam current values are measured by the sensors. This displacement can be determined from the measured beam current values, to be precise in terms of absolute value and in terms of direction. This displacement can be corrected by way of an appropriate closed-loop beam current control mechanism and hence the beam current can also be adjusted at the individual positions of the multi-aperture array. This correction or closed-loop control may also be implemented at a high-frequency; this will be explained in more detail below.

According to an embodiment of the disclosure, controlling the high-frequency component of the beam current via the first closed-loop beam current control mechanism includes the following step: adjusting the illumination of the multi-aperture array in a high-frequency manner. In this case, the illumination of the multi-aperture array can be centered and/or the beam current itself is adjusted. The beam current is adjusted by widening or reducing the incident beam cone in a high frequency manner. To this end there are in turn a number of exemplary embodiments:

According to an embodiment of the disclosure, the first closed-loop beam current control mechanism comprises an electrostatic double deflector in the region of a condenser lens system. In this case, the condenser lens system can comprise one, two, three or more condenser lenses. A condenser lens may be a magnetic lens, but may also be an electrostatic lens. An electrostatic double deflector in the region of the condenser lens system allows the beam cone generated by the condenser lens system to be offset in parallel and hence allows an adjustment of the position/centration of the illumination of the multi-aperture array. Unlike conventionally provided magnetic deflectors, an electrostatic double deflector can be driven quickly and is suitable for a fast feedback loop for closed-loop beam current control in a multi-beam particle microscope.

According to an additional or alternative embodiment of the disclosure, the first closed-loop beam current control mechanism comprises an electrostatic condenser lens. An electrostatic condenser lens can be driven quicker than a magnetic condenser lens and is therefore likewise suitable for fast feedback and closed-loop beam current control in a multi-beam particle microscope.

According to an embodiment of the disclosure, the first closed-loop beam current control mechanism comprises an electrostatic control lens which is arranged between an extractor electrode and an anode of a beam generating system of the multi-beam particle microscope. In general, the beam generating system is thus provided with a further interposed fast electrode. This may be a lens or a simple plate, to which a voltage is applied. The electrostatic control lens can be biased in order to facilitate fast changes in the diameter of the first beam cone, which is incident on the multi-aperture array, in both directions (narrower or wider). The change in the diameter of the beam cone incident on the multi-aperture array brought about by the electrostatic control lens is only very small but facilitates a fine adjustment of the beam current. A further advantage of this embodiment is that although there is a change in the voltage in the region of the beam producing system, this change is not implemented at the extractor electrode and there is also no need to change the acceleration voltage per se. From a technical point of view, a few millimetres space are available between the extractor electrode and the anode, and the electrostatic control lens or control electrode can be arranged therein.

Thus, there are a plurality of embodiment variants for a first closed-loop beam current control mechanism, with these embodiment variants being able to be combined with one another in full or in part. Other embodiment variants are also possible.

In addition or as an alternative to the closed-loop control of the high-frequency component of the beam current via a first closed-loop beam current control mechanism, an effect of the high-frequency component on the recording quality of the multi-beam particle microscope can be compensated according to the disclosure using different mechanisms than a closed-loop beam current control mechanism.

According to an embodiment of the disclosure, a detection system of the multi-beam particle microscope is driven on the basis of the high-frequency deviation of the beam current from the nominal beam current, a high-frequency adjustment of a gain and/or an offset of the detection system being carried out on the basis of the high-frequency deviation of the beam current from the nominal beam current. In this way, it is possible to adjust a brightness and/or a contrast of the images obtained via the detection system. In this case, the detection system can be adjusted globally for all channels (all detection regions) or individually for individual channels (individual detection regions) of individual particle beams.

In this case, adjusting a gain and/or an offset of the detection system causes an adjustment in the brightness and/or contrast. As a result of this adjustment option, it is possible to compensate a fast variation in the beam current in all individual particle beams or in single individual particle beams in the secondary path of the multi-beam particle microscope. The closed-loop control concept according to this embodiment variant is based on the fact that the influence of a beam current change on the brightness and/or on the contrast of images produced via the detection system is known in general. Knowledge of this relationship facilitates the corresponding correction or compensation of the beam current variation. In this embodiment variant of the disclosure, it is advantageous also to correct the drift of the beam current in addition to the compensation of effects in the high-frequency component of the beam current deviation. Controlling the drift of the beam current at the same time ensures that the detection system operates dynamically in an optimal range and that noise in the detection system does not increase excessively either. Further details relating to the detector adjustment and to the relationship between brightness and contrast on the one hand and the adjustment of a gain and an offset of the detection system on the other hand can be gathered from the German patent application DE 10 2018 007 455 A1, the disclosure of which is incorporated in this patent application in full by reference.

According to an embodiment of the disclosure, the compensation of effects of the high-frequency component on the recording quality of the multi-beam particle microscope includes the following step: adapting a scanning speed with which the plurality of individual particle beams scan over the surface of a sample. By adapting a scanning speed, the first individual particle beams each dwell at a certain location for a longer or shorter period of time or scan a respective pixel for a longer or shorter period of time. More secondary particles which can be detected emerge from the sample surface in this way. Thus, the beam current of the second individual particle beams, which are incident on a detection system, are ultimately varied in this way. Optionally, this variation is alike for all individual particle beams. By way of example, the scanning speed can be adapted by changing the clock frequency on the scan generator. In this case, a typical change in the clock frequency on the basis of the measured high-frequency deviation of the beam current, in particular on the basis of the measured high-frequency deviation of the overall beam current, from the nominal beam current is up to approximately +/−10% of the nominal clock frequency in this case, but deviations of +/−15% or else only +/−5% are also conceivable, with the interval boundaries being included in each case. In general, the scanning speed can be adjusted for each line that is recorded. However, it is also possible to adapt the setting only for a set of lines, for example in the case of an image field change (change from mFOV to mFOV).

According to a an embodiment of the disclosure, the method furthermore includes the following step: logging the measured beam current values. In this case, a log is generated, in which the measured beam current values at their respective times are entered. It is possible to collect quite generally all available beam current values in this log since the more complete the capture of the values, the more precisely both a drift correction and a high-frequency correction of the beam current can be implemented.

According to an embodiment of the disclosure, the method includes estimating the residual service life of a tip of the beam generating system and/or initiating a replacement of the tip. The residual service life of a tip can be estimated by an algorithm from the logged beam current values. This is because examinations of the inventors have disclosed, in general, how beam current values develop over the course of the service life of a tip. When a tip needs to be replaced depends on the number of operating hours or else on error states during the operation; moreover, other operational parameters such as the ambient temperature, the vacuum generated, voltage variations or voltage changes during the operational time may influence the service life of the tip. Therefore, the replacement time also differs from tip to tip since the utilized tips differ from one another even in the case of an identical production/specification. The beam current in the outer regions of the beam cone generated by the tip is slightly greater than in the inner region in the case of comparatively new tips. This relationship arises on account of the emission behaviour of the tip with a certain tip radius, that is to say on account of its geometry. The differences in the distribution of the beam current or beam current density between inside and outside equalize as the tip ages. If this increasing homogeneity is detected, this allows an impending replacement of the tip to be deduced. In respect of the drift to be observed, it is also possible to readjust the voltage of the extractor electrode. In this case, the extraction voltage can be initially increased incrementally over the service life. Just before failure, however, a tip supplies such a high beam current that the extraction voltage has to be down regulated. This drift reversal can thus be taken as an indication for a tip replacement being due in the near future.

It is possible to display the residual service life of a tip of the beam generating system that emerges from the algorithm on the multi-beam particle microscope or present the residual service life on an output unit. It is also possible to automatically request maintenance for the multi-beam particle microscope, to the end of a tip replacement, or to automatically order a tip.

According to a second aspect of the disclosure, the latter relates to a computer program product having a program code for carrying out the method as described above in a plurality of embodiment variants. In this case, the program code can be subdivided into one or more partial codes.

According to a third aspect of the disclosure, the latter relates to a multi-beam particle microscope comprising the following:

- a beam generating system comprising a particle source, an extractor electrode and an anode and configured to produce a first charged particle beam, the beam generating system moreover comprising an electrostatic control lens arranged between the extractor electrode and the anode;
- a multi-beam generator having a multi-aperture array, the multi-beam generator being configured to produce a first field of a plurality of first individual charged particle beams from the first charged particle beam;
- a first beam current measuring mechanism at the multi-aperture array of the multi-beam generator;
- a first particle optical unit with a first particle optical beam path, configured to direct the produced first individual particle beams at a sample such that the first individual particle beams strike the sample at incidence locations, which form a second field;
- a detection system;
- a second particle optical unit with a second particle optical beam path, which is configured to image second individual particle beams, which emanate from the incidence locations in the second field, onto the detection system;
- a particle optical objective lens, through which both the first and the second individual particle beams pass;
- a beam switch, which is arranged in the first particle optical beam path between the multi-beam generator and the objective lens and which is arranged in the second particle optical beam path between the objective lens and the detection system; and
- a controller which is configured to control the beam generating system, the particle optical objective lens, the first particle optical unit, the second particle optical unit, and the detection system, and
- with the controller being configured for driving, in particular high-frequency driving, of the electrostatic control lens on the basis of the current measurement via the first beam current measuring mechanism.

The multi-beam particle microscope according to the disclosure is suitable for carrying out the above-described method for operating a multi-beam particle microscope. In this case, the beam current can be measured via the first beam current measuring mechanism at the multi-aperture array of the multi-beam generator. In this case, the first beam current measuring mechanism may comprise a plurality of sensors, in particular exactly three sensors or more than three sensors, for measuring the current on the upper side of the multi-aperture array. According to an embodiment of the disclosure, exactly three sensors are arranged in the form of a triangle, in particular in the form of an equilateral triangle, around the outside of the plurality of apertures of the multi-aperture array. As already described above in conjunction with the method, both the beam current itself and the alignment of the first charged particle beam upon incidence on the multi-aperture array can be determined via this arrangement. High-frequency driving of the electrostatic control lens in this case controls the beam current, and so a high-frequency deviation of the beam current from a nominal beam current can be corrected. According to an alternative embodiment variant, a second beam current measuring mechanism, which measures the overall beam current of the individual particle beams, can be used for the purposes of measuring the beam current instead of the first beam current measuring mechanism and the controller can be configured for driving, in particular high-frequency driving, of the electrostatic control lens, on the basis of the current measurement via the second beam current measuring mechanism. An example of the second beam current measuring mechanism is described in more detail below. The electrostatic control lens can be in the form of a simple plate with a central circular opening, to which a voltage has been applied. The lens effect of this plate then arises from the interaction with the remaining plates or electrodes of the beam generating system. The controller is configured for appropriate feedback.

According to an embodiment of the disclosure, the multi-beam particle microscope furthermore comprises the following:

- a multi-beam deflection device arranged in the first particle optical beam path, downstream of the multi-beam generator and upstream of the beam switch; and
- a beam stop having a second beam current measuring mechanism, the beam stop being arranged in the first particle optical beam path upstream of the objective lens, level with a cross-over plane;

the controller being configured to collectively deflect the first individual particle beams temporarily via the multi-beam deflection device such that the first individual particle beams are substantially incident on the beam stop and consequently not incident on the object plane. Such an arrangement of a beam stop and a multi-beam deflection device is already known from the incorporated patent DE 10 2019 008 249 B3, which was cited above. The latter discloses, inter alia, a rotationally symmetric cup with a central passage opening, into which the plurality of individual particle beams are deflected in a targeted manner in the case of a line jump or in the case of an image jump, the cup being able to comprise the second beam current measuring mechanism or being able to be connected thereto. In this way, a beam current intensity (overall beam current) can be determined during an image recording procedure by way of the presented configuration.

According to an embodiment of the disclosure, the controller is configured for high-frequency driving of the electrostatic control lens on the basis of a current measurement via the first beam current measuring mechanism. However, additionally or alternatively, it is also possible to drive a different particle optical component or even a different component of the multi-beam particle microscope on the basis of the beam current measured via the second beam current measuring mechanism in order to improve the recording quality of the multi-beam particle microscope overall.

According to an embodiment of the disclosure, the detection system has a plurality of detection regions that form a third field, the second individual particle beams emanating from the second field being imaged onto the third field. Moreover, the controller is configured for adjustment, in particular high-frequency adjustment, of a gain and/or an offset of the detection system on the basis of a beam current measurement via the second beam current measuring mechanism. Thus, this feedback loop targets the compensation of an effect of the high-frequency component on the recording quality. It is possible to set the brightness and/or the contrast of the individual image fields or multi-image field overall, that is to say the detection regions of the detection system can be driven on an individual basis or else they can be driven globally.

The detection system can comprise one detector or a plurality of detectors of the same type or of different types. The detection system can, e.g., comprise or consist of one or more particle detectors. A particle detector can in turn be formed in one part or in many parts. However, it is also possible to combine one or more particle detectors and light detectors with one another, or to connect them in series, in the detection system.

According to an embodiment of the disclosure, the detection system comprises a particle detector and a plurality of light detectors connected downstream thereof. Specifically, the particle detector can comprise a scintillator plate having a plurality of detection regions. In this case, projecting the interaction products onto the detection regions of the particle detector is carried out with the aid of a suitable particle optical unit. In this case, the light signals emitted by the particle detector pass in a suitable manner to a light detector (detection channel) assigned to the respective detection region of the particle detector. It is possible, for example, for the light emitted by a detection region of the particle detector to be coupled into optical fibers via a corresponding light optical unit, the fibers in turn being connected to the actual light detector. The light detector comprises for example a photomultiplier, a photodiode, an avalanche photodiode, or other types of suitable light detectors.

According to an alternative embodiment variant of the detection system, the latter comprises a particle detector but no light detectors. It is then possible to detect the particles directly, without the detour via photons, for example by them being injected into the depletion layer of a semiconductor, whereby once again an electron avalanche can then be initiated. This then involves a correspondingly structured semiconductor detector comprising at least one independent conversion unit for each beam.

In general, a gain of a detection system specifies the amount of output generated by an amount of input. Specifically, the gain indicates the number of particles of the second particle species (out) contained in the output in relation to the number of particles of the first particle species (in) contained in the input. In the case of an avalanche photodiode, the input is formed by photons and the output is electrons. The same can analogously be defined for all other detectors, DED ("direct electron detection"), PMT ("photomultiplier tube"), etc. Furthermore, many detectors that carry out conversion into an electrical signal (current or voltage drop across an output resistor) have a post amplifier, the gain of which is likewise adjustable.

The offset in turn indicates how high the level of the output signal is if no primary particles arrive. That is generally solved in the downstream electronic circuitry via a voltage adder. Ultimately, leakage currents, etc. are thus compensated for via these systems. Offset and gain are generally not independent of one another.

If there is a high-frequency readjustment of the detection system, as described above, for the purposes of compensating effects based on high-frequency deviations from the nominal beam current, it is advantageous to simultaneously also correct the drift of the beam current. This ensures that the dynamic range in which the detection system operates remains optimal and that there is no excessive increase in noise.

According to an embodiment of the disclosure, the multi-beam particle microscope furthermore comprises a collective scan deflector configured to collectively deflect the first individual particle beams and collectively scan these over a sample surface. In this case, the controller is configured for driving of the scan deflector and for adjustment of scanning speed of the collective scan deflector on the basis of a current measurement via the first and/or second beam current measuring mechanism. Thus, in this embodiment variant, it is not the beam current of the first individual particle beams that is controlled per se but instead there is a correction of the current on the sample incident on an individual pixel overall. A lower beam current can be compensated by a slower scanning speed; a higher beam current can be compensated by a faster scanning speed. This at least applies within certain boundaries. A deviation from the nominal scanning speed can be less than or equal to +/−12%, +/−10% or +/−5%. In this case, the scanning speed is the same for all individual particle beams. In particular, there can be a high-frequency adjustment of the scanning speed in the process. It is possible to adjust the scanning speed practically instantaneously, for example for each multi-image field (mFOV) or even for each line that is scanned collectively. However, it is also possible to keep the scanning speed constant for the recording of a plurality of multi-image fields.

According to an embodiment of the disclosure, the multi-beam particle microscope moreover comprises a condenser lens system which is arranged between the beam generating system and the multi-beam generator. In this case, the controller is configured for driving of the condenser lens system on the basis of a current measurement via the first and/or second beam current measuring mechanism. By way of example, the condenser lens system comprises exactly two magnetic lenses or at least two magnetic lenses. Depending on which of these lenses is energized or depending on how strong these lenses are respectively energized, it is possible to set the illumination of the multi-aperture array. Moreover, the beam current intensity is also adjusted. In the case of a condenser lens system with magnetic lenses, the driving of the condenser lens system can usually only be changed slowly on account of the self-induction that arises and counteracts the applied voltage and on account of the hysteresis effects that arise. Therefore, the condenser lens system can be driven in quasi-static or low-frequency fashion. However, the condenser lens system may also have one or more electrostatic lenses. An electrostatic lens can be driven more quickly and the condenser lens system is potentially then also suitable for high-frequency beam current adaptation or illumination adaptation.

According to an embodiment of the disclosure, the multi-beam particle microscope moreover comprises an, in particular, electrostatic double deflector in the region of the condenser lens system. In this case, the controller is configured for, in particular, high-frequency driving of the double deflector on the basis of a current measurement via the first and/or second beam current measuring mechanism. Via the double deflector it is possible to carry out a parallel offset of the beam cone of the first charged particle beam in order to direct the latter in centered fashion at the multi-aperture array of the multi-beam generator. In particular, a beam current measurement using the first beam current measuring mechanism at the multi-aperture array makes it possible to determine whether the beam cone of the first charged particle beam is offset in relation to the central axis of the multi-aperture array or to the optical axis of the overall system. This offset can be corrected. This correction is instantaneous and hence possible at a high frequency; however, in general it is also possible to drive the double deflector in quasistatic fashion in order to even attain a sufficiently accurate adjustment of the condenser lens system or overall system, or in order to undertake a drift correction.

According to an embodiment of the disclosure, the controller is configured for low-frequency driving of the extractor electrode on the basis of a current measurement via the first and/or second beam current measuring mechanism. Thus, this does not relate to fast control but to drift correction. After driving of the extractor electrode has changed, experience has shown that it takes some time, for example approximately two to three days, until the particle source or the tip of the beam generating system has adjusted to the new situation and has "burned in".

The above-described embodiment variants according to the first to third aspect of the disclosure can be combined with one another in full or in part, provided that no technical contradictions arise as a result.

BRIEF DESCRIPTION OF THE FIGURES

In this context, the disclosure will be understood even better with reference to the accompanying figures, in which.

DETAILED DESCRIPTION

Figure 1:
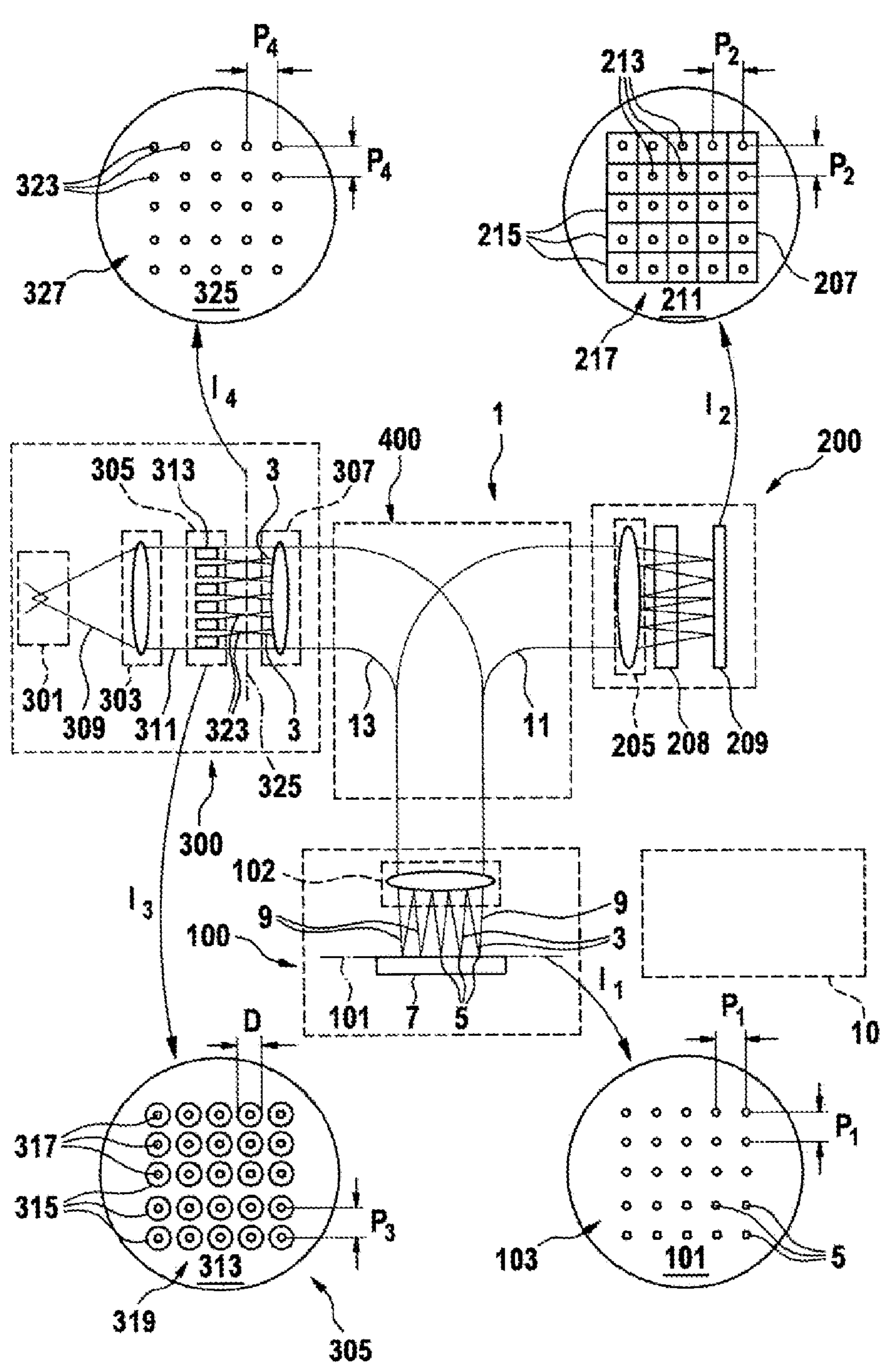
FIG. 1: shows a schematic representation of a multi-beam particle microscope (MSEM)

FIG. 1 is a schematic representation of a particle beam system 1 in the form of a multi-beam particle microscope 1, which uses a plurality of particle beams. The particle beam system 1 generates a plurality of particle beams which strike an object to be examined in order to generate there interaction products, e.g., secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type, e.g., a semiconductor wafer or a biological sample, and comprise an arrangement of miniaturized elements or the like. The surface of the object 7 is arranged in a first plane 101 (object plane) of an objective lens 102 of an objective lens system 100.

The enlarged excerpt I1 in FIG. 1 shows a plan view of the object plane 101 having a regular rectangular field 103 of incidence locations 5 formed in the first plane 101. In FIG. 1, the number of incidence locations is 25, which form a 5×5 field 103. The number 25 of incidence locations is a number chosen for reasons of simplified illustration. In practice, the number of beams, and hence the number of incidence locations, can be chosen to be significantly greater, such as, for example, 20×30, 100×100 and the like.

In the depicted embodiment, the field 103 of incidence locations 5 is a substantially regular rectangular field having a constant pitch P1 between adjacent incidence locations. Exemplary values of the pitch P1 are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles striking the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the plurality of secondary particle beams 9 to a detector system 200. The detector system 200 comprises a particle optical unit with a projection lens 205 for directing the secondary particle beams 9 at a particle multi-detector 209.

The excerpt 12 in FIG. 1 shows a plan view of the plane 211, in which individual detection regions of the particle multi-detector 209 on which the secondary particle beams 9 are incident at locations 213 are located. The incidence locations 213 lie in a field 217 with a regular pitch P2 from one another. Exemplary values of the pitch P2 are micrometers, 100 micrometers, and 200 micrometers.

The primary particle beams 3 are produced in a beam generating apparatus 300 comprising at least one particle source 301 (e.g., an electron source), at least one collimation lens 303, a multi-aperture arrangement 305 and a field lens 307. The particle source 301 produces a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch P3 between the midpoints 317 of the apertures 315 can have exemplary values of 5 micrometers, 100 micrometers, and 200 micrometers. The diameters D of the apertures 315 are smaller than the pitch P3 between the midpoints of the apertures. Exemplary values of the diameters D are 0.2×P3, 0.4×P3, and 0.8×P3.

Particles of the illuminating particle beam 311 pass through the apertures 315 and form particle beams 3. Particles of the illuminating beam 311 which strike the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle optical unit for imaging the plane 325, in which the beam foci 323 are formed, onto the first plane 101 such that a field 103 of incidence locations 5 or beam spots arises there. Should a surface of the object 7 be arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens that is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881 A2, WO 2007/028595 A2, WO 2007/028596 A1, WO 2011/124352 A1 and WO 2007/060017 A2 and the German patent applications DE 10 2013 016 113 A1 and DE 10 2013 014 976 A1, the disclosure of which in the full scope thereof is incorporated by reference in the present application.

Figure 2:
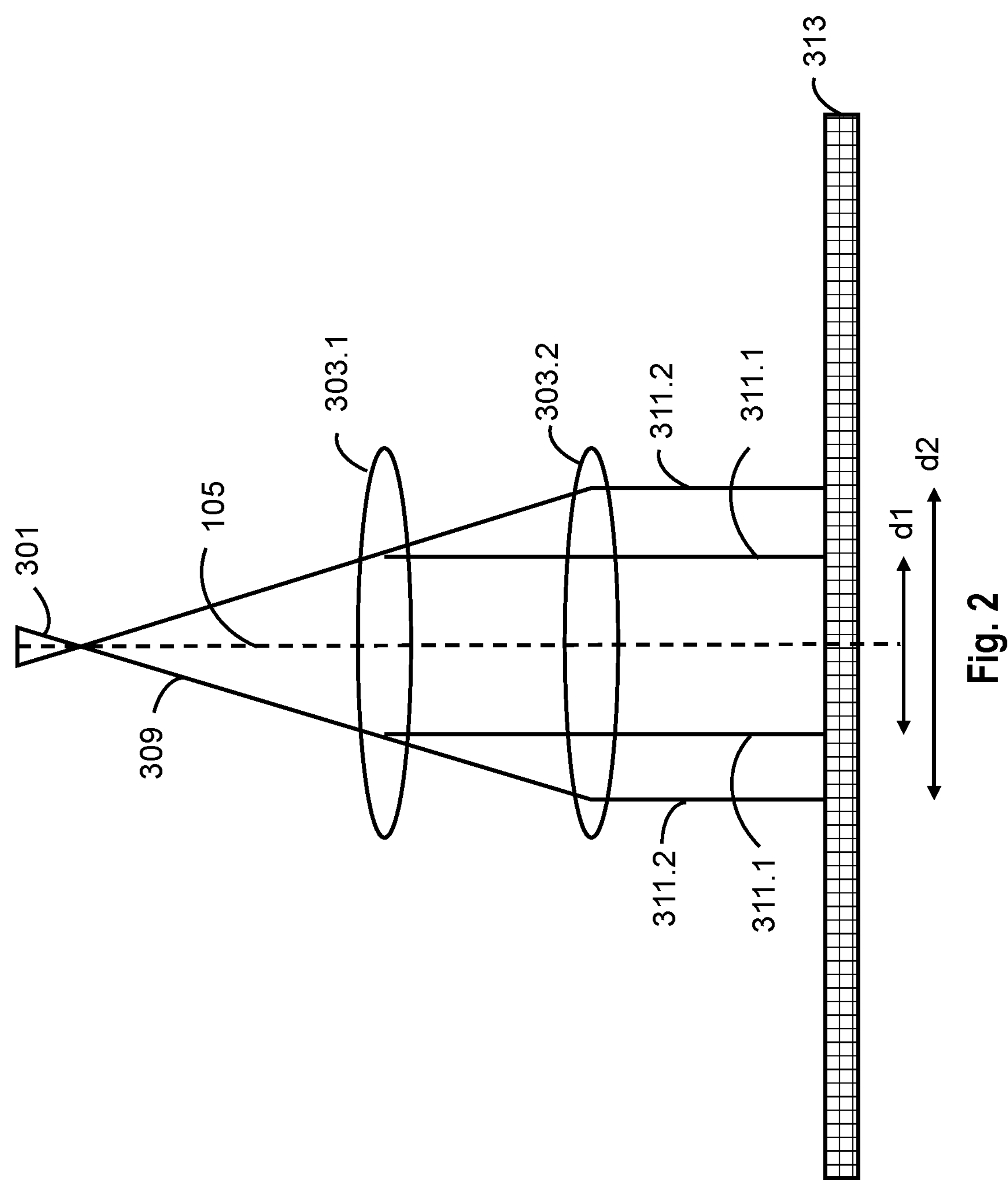
FIG. 2: shows a schematic representation of an adjustment of the beam cone of the illuminating beam upon incidence on a multi-aperture array.

FIG. 2 shows a schematic representation of an adjustment of the beam cone of the illuminating beam 311 upon incidence on a multi-aperture array 313. The beam current per individual particle beam 3 can be adjusted by adjusting the beam cone. Initially, particles or a divergent particle beam 309 are emitted by a source 301. The divergent particle beam 309 passes through a collimation lens system or condenser lens system 303, which comprises two condenser lenses 303.1 and 303.2 in the present example. FIG. 2 now shows two different settings of the condenser lens system 303: In a first setting, the condenser lens 303.1 is activated and the condenser lens 303.2 is deactivated. As a result, the particles of the divergent particle beam 309 are collimated in the condenser lens 303.1 and strike the multi-aperture array 313 as an illuminating particle beam 311.1 with the diameter d1. In the second case, the condenser lens 303.1 is deactivated and the condenser lens 303.2 is activated. Hence, the divergent particle beam 309 expands further and is only collimated in the second condenser lens 303.2 such that an illuminating particle beam 311.2 with the diameter d2 is incident on the multi-aperture plate 313. The number of particles incident on the multi-aperture array 313 is the same in both cases but the density differs. Thus, individual particle beams 3 with different beam current intensities that depend on the diameter of the illumination spot are formed when the multi-aperture array 313 with its openings 315 (not shown) is traversed.

In the example shown, the condenser lenses 303.1 and 303.2 are magnetic lenses in each case. However, it is also possible to replace one or both of the magnetic lenses with an electrostatic condenser lens. Moreover, it is possible to change the number of condenser lenses in the condenser lens system 303 overall, that is to say provide only one lens or else provide three or more lenses. Moreover, one or more deflectors can be provided for the adjustment of the illuminating beam 311. These adjustment mechanisms and the type of condenser lens(es) have an influence on how quickly the illumination spot can be adjusted. This will be discussed in more detail below, within the scope of this patent application. Initially, all that should be illustrated here is how the different beam currents of the individual particle beams arise when different illumination spots are used.

Figure 3B:
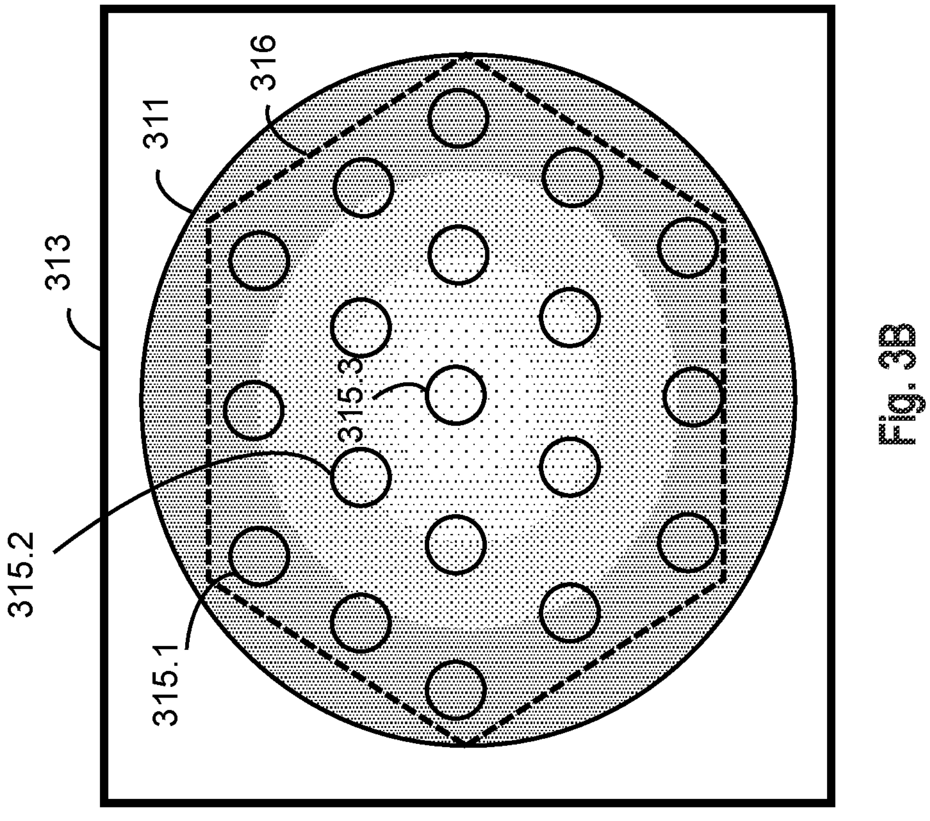
FIGS. 3A-3B: show schematic representations of an illumination spot with a current density variation upon incidence on a multi-aperture array.
Figure 3A:
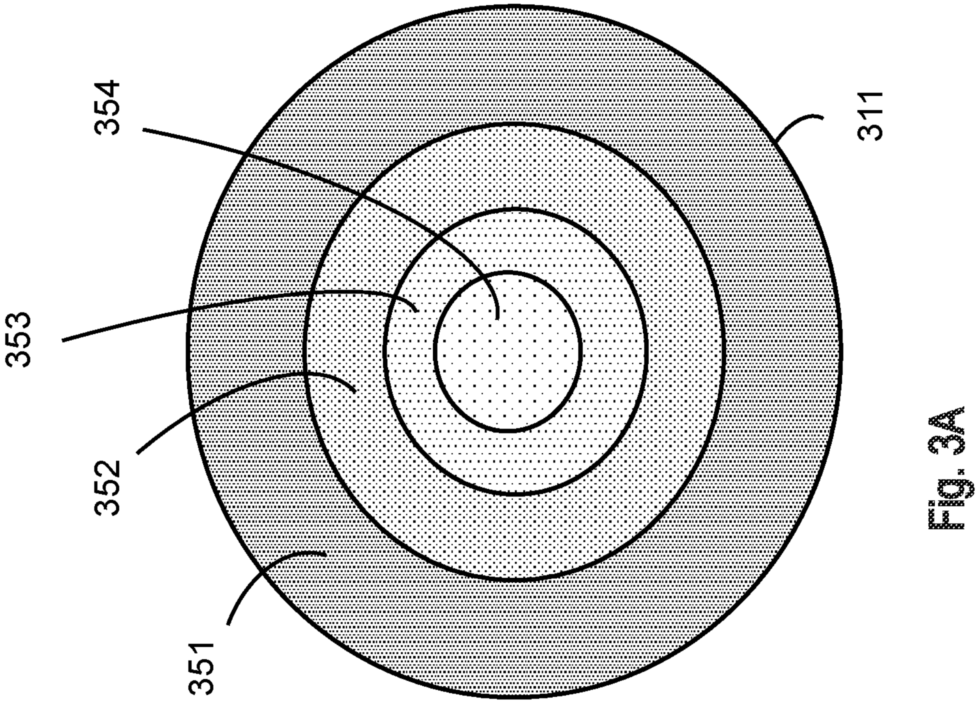

FIG. 3 shows a schematic representation of an illumination spot with a current density variation upon incidence on a multi-aperture array 313. FIG. 3A initially shows the current density variation in the cross section of the illuminating particle beam 311. The beam current density varies slightly within this cross section. This variation is substantially caused by the geometry of the particle source 301 or of a tip 340 the particle source 301. In this case, the outer region 351 of the beam 311 in the example shown has a higher current density than the regions 352, 353 and 354 located further inside. The current density is lowest in the central region 354. The different currents or current densities are indicated by different patterns/fills in FIG. 3A, a darker fill indicating more current. Naturally, the transitions from the outside to the inside can be continuous; the sharp concentric rings in FIG. 3A only serve to elucidate the concept.

FIG. 3B shows the beam 311 upon incidence on the multi-aperture plate 313. In the present example, the multi-aperture plate 313 has 19 openings 315, which are arranged in hexagonal fashion in the example shown. The hexagonal arrangement is elucidated further by the hexagon 316 plotted using dashed lines. Thus, particles of the particle beam 311 now pass through the various openings 315 and individual particle beams 3 are formed. The remaining particles of the particle beam 311 are incident on the plate 313.

The plate 313 is usually grounded so that the incident charges are discharged. This can also be exploited for measuring current (see below).

It is evident from FIG. 3B that more charged particles or a higher current passes through some of the openings 315 than through other openings. The opening 315.1 is located in an outer region and therefore experiences comparatively many charged particles passing therethrough; the individual particle beam formed has a slightly higher current density. The opening 315.2 is arranged slightly closer to the center of the beam cone 311, the particle current passing therethrough is slightly lower than in the case of the opening 315.1. The opening 315.3 is positioned at the center, a beam current that is lower than all the other beam currents passes therethrough.

Figure 4:
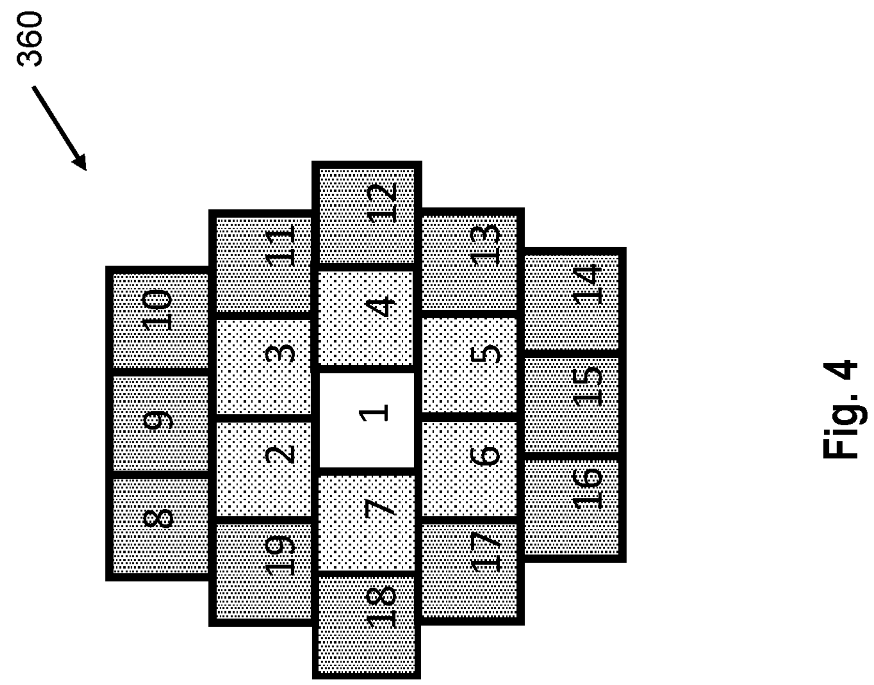
FIG. 4: shows a schematic representation of beam current intensities of a plurality of individual particle beams arranged in hexagonal fashion.

FIG. 4 shows a schematic representation of beam current intensities of a plurality of individual particle beams 3 arranged in hexagonal fashion. A field is assigned to each of the 19 individual particle beams 3 in the beam current intensity representation 360, the fields being numbered in the example shown. In this case, the representation in FIG. 4 does not show an image field but merely an illustration of the measured beam current intensities. These can be measured by conventional approaches, for example a Faraday cup which is arranged on, e.g., a displaceable sample stage (stage). Such a conventional measurement takes a comparatively long period of time, an individual measurement taking approximately half an hour. The various grayscale values of the pattern fills in FIG. 4 once again illustrate the various beam current intensities, a darker fill representing a higher beam current intensity than a lighter fill.

In general, the beam current intensity of each individual particle beam 3 is very well known or very accurately measurable. For a recording with the multi-beam particle microscope, it is desirable to ensure that each individual particle beam 3 supplies a sufficient beam current, that is to say the beam current does not drop below a certain limit By way of example, it is possible to demand an individual beam current of at least 500 pA or 600 pA, for example at least 560 pA, at least 570 pA or at least 580 pA, for each individual particle beam. It is also possible to define a nominal beam current as a permitted range. In general, this demands uniformity of the individual beam currents in addition to a minimum beam current or in addition to an average beam current. In this case, a difference between a maximum beam current value and a minimum beam current value may only have a certain maximum value. By way of example, the entire range, that is to say the difference, may be no more than 10 pA. The uniformity can also be specified in the form of percentages. By way of example, the uniformity can be defined as follows: Uniformity [%]=(maximum value−minimum value)/mean value×0.5×100 Other definitions are also possible and reasonable.

Moreover, it is also possible to measure the overall beam current. To this end, the individual particle beams 3 need not be measured on an individual basis; it is also possible to determine the overall beam current simultaneously for all individual particle beams, for example at a time at which all individual particle beams are blanked to the same location/on the same detector (cf., explanations in relation to FIG. 9).

According to an embodiment of the disclosure, the multi-aperture array 313 has on its upper side a grounded metal layer which absorbs and discharges excess electrons. One or more respectively grounded sensors 370 that measure the incident electron current at the position of the respective sensor may be arranged above this metal layer. It is also possible to structure the metal layer itself and to measure the beam current segment-by-segment or with spatial resolution on the basis of this structuring. This measuring system may be calibrated, for example by virtue of the individual particle beams 3 being measured using a displaceable stage and, for example, a Faraday cup thereon. Other embodiment variants and calibration methods are also conceivable.

Figures 5A, 5B:
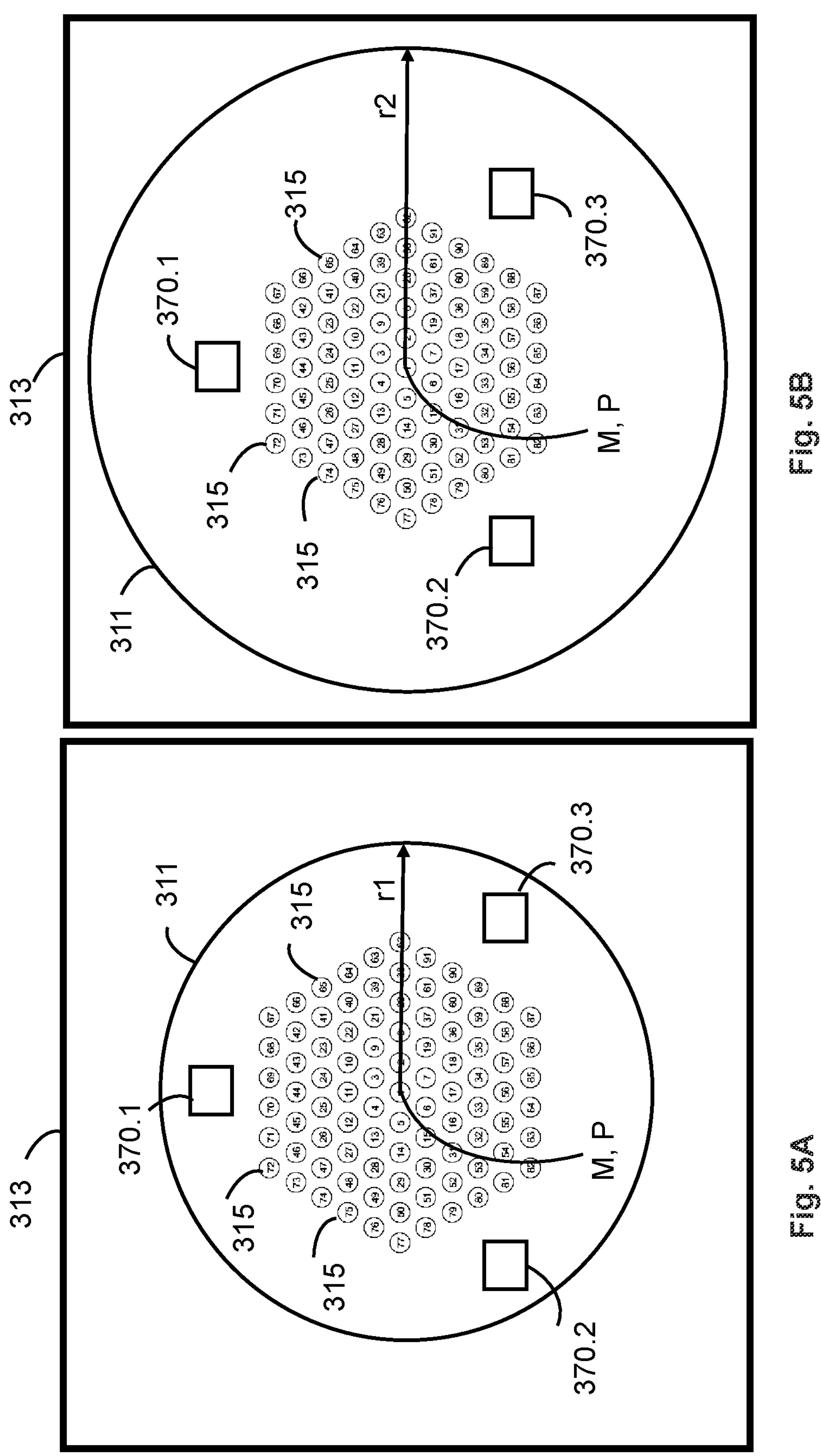
FIGS. 5A-5B: show schematic representations of a first beam current measuring mechanism on the upper side of a multi-aperture array, the multi-aperture array being illuminated by beam cones with different diameters.

FIG. 5 shows a schematic representation of a first beam current measuring mechanism 370 on the upper side of a multi-aperture array 313, the multi-aperture array 313 being illuminated by beam cones 311 with different diameters. In the example shown, the multi-aperture array 313 has a total of 91 holes for generating 91 individual particle beams 3. Once again, the arrangement of the openings 315 is hexagonal. Located around the hexagonal arrangement of the openings 315 to the outside is the first beam current measuring mechanism 370, the first beam current measuring mechanism 370 having a three-part representation in the example shown. It comprises three sensors 370.1, 370.2 and 370.3 on the upper side of the multi-aperture array 313. The three sensors 370.1, 370.2 and 370.3 are arranged around the plurality of apertures 315 to the outside, in the form of an equilateral triangle. This geometric arrangement allows much information to be obtained about the expansion and the position of the illuminating particle beam 311, which is incident on the multi-aperture array 313, while using only a few sensors. In the example of FIGS. 5A-5B shown, the beam cone of the illuminating particle beam 311 strikes the multi-aperture plate 313, a midpoint M of the illumination spot being identical to the midpoint P of the multi-aperture array 313 where the opening 1 is located. In the case of the centered incidence of the illuminating particle beam 311 on the multi-aperture plate 313, all sensors 370.1, 370.2 and 370.3 are impinged with a current of the same intensity in the case of an appropriate symmetric and equally spaced apart arrangement. If the characteristic or the gradient of the current intensity is known within the entire beam cone, for example as a result of a calibration, the radius r1 or the diameter d1 of the illumination spot of the illuminating particle beam 311 can be determined from the measured current intensities. FIGS. 5A and 5B differ in terms of the size of the illumination spot, the illumination spot being larger in FIG. 5B and having a radius r2 instead of only a radius r1 as in FIG. 5A. The current intensity measured by the sensors 370.1, 370.2 and 370.3 according to FIG. 5B is identical at each of the sensors but lower in terms of absolute value than in the case of FIG. 5A.

Figure 6B:
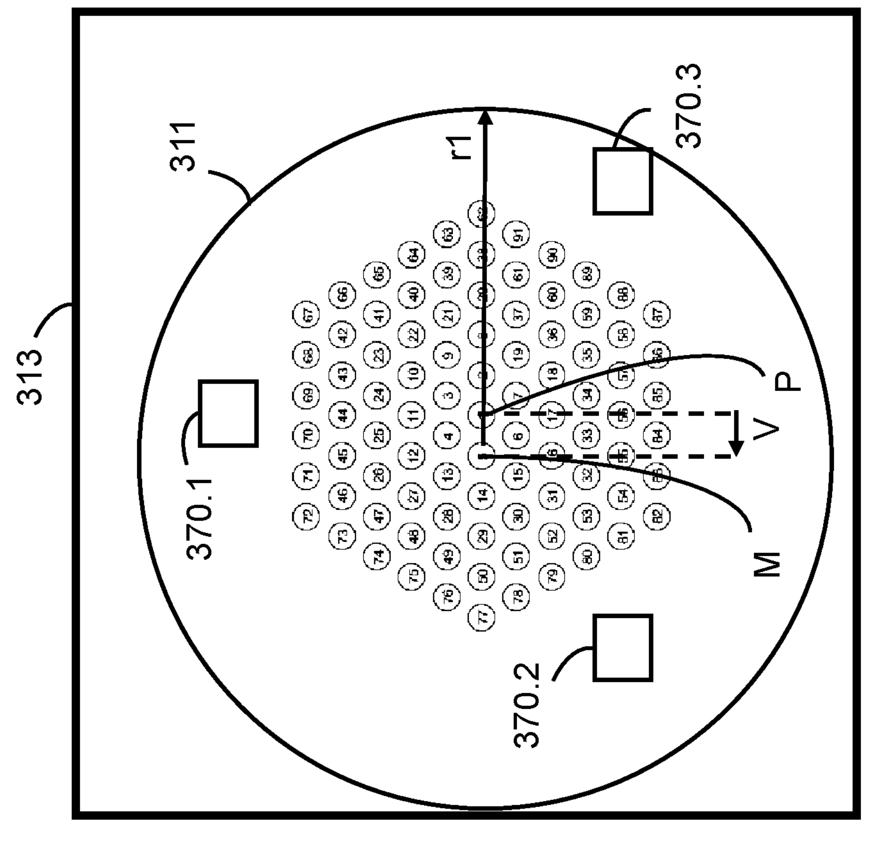
FIGS. 6A-6B: show schematic representations of a displacement of a beam cone on the multi-aperture array.
Figure 6A:
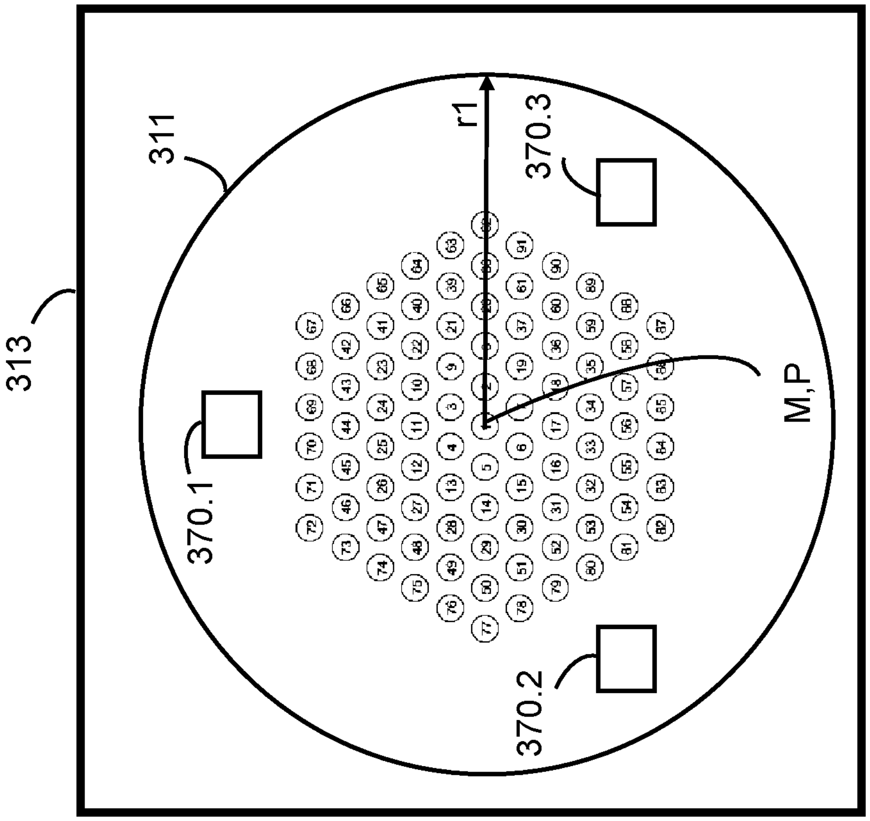

FIG. 6B shows—unlike FIGS. 5A-5B—no centered incidence of the illuminating particle beam 311 on the multi-aperture array 313; instead, FIG. 6B illustrates an off-centered incidence or a displacement V upon incidence. In FIG. 6A, the midpoint M of the beam spot and the midpoint P of the multi-aperture array 313 coincide in space. In FIG. 6B, the midpoint M of the beam spot, the radius r1 of which has remained unchanged in comparison with FIG. 6A, is displaced in relation to the midpoint P of the multi-aperture array 313: This displacement V is likewise plotted in FIG. 6B. Accordingly, the sensors 370.1, 370.2 and 370.3 now each measure different current intensities. The respective deviations of the measured values from one another in this case form a characteristic pattern which allows deductions to be made about the displacement on the basis of a calibration carried out in advance.

Figure 7:
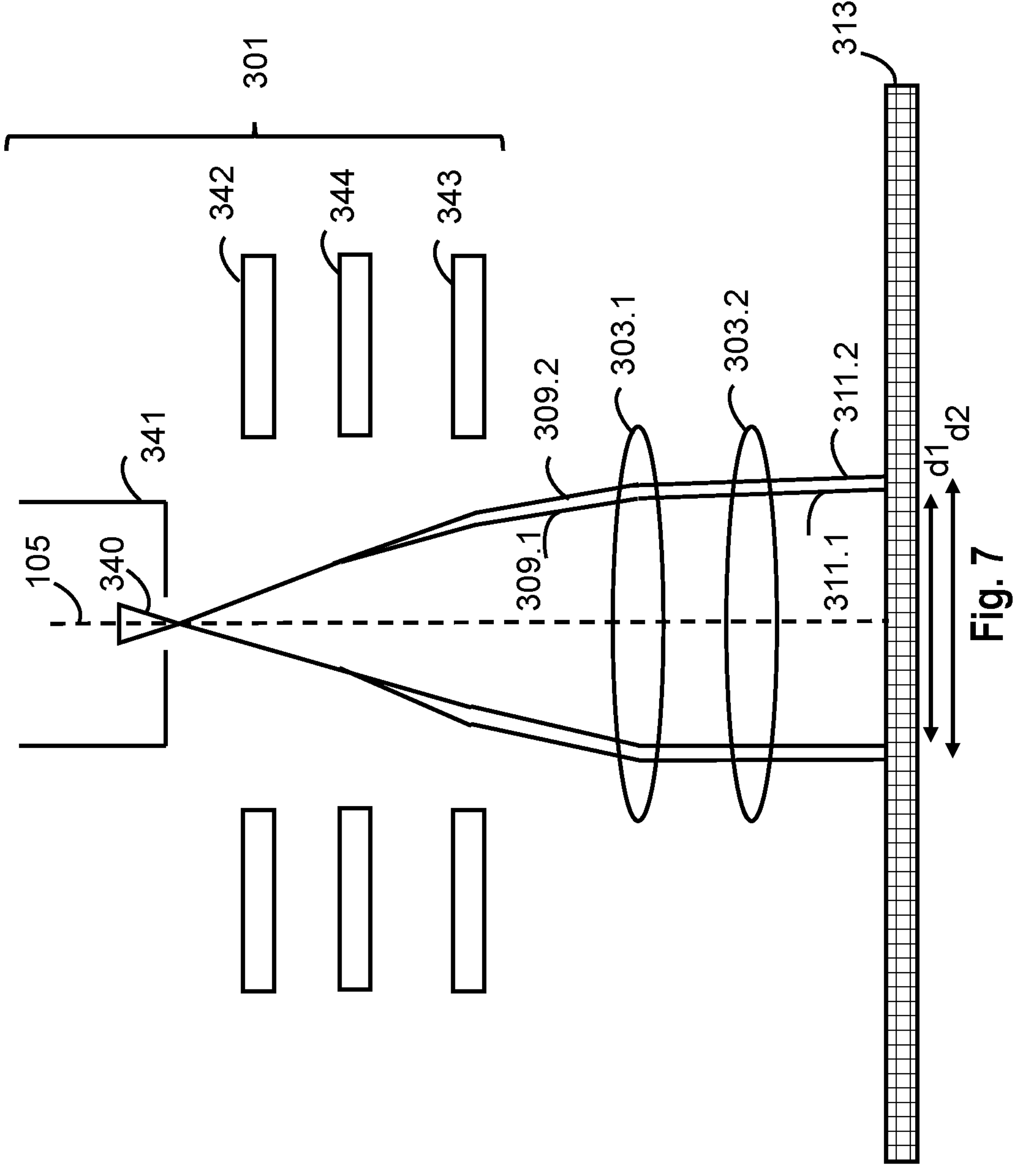
FIG. 7: shows a schematic representation of a beam generating system having an electrostatic control lens between extractor electrode and anode, the system being suitable for high frequency closed-loop beam current control.

Now that the preceding passages have described how different beam currents arise and have explained different types of the beam current measurements, the emphasis below shifts to the correction of beam current variations. In this context, FIG. 7 shows a beam generating system 301 having an additional electrostatic element for correction purposes. In the example shown, the beam generating system 301 is constructed as follows: It comprises a tip 340 which is surrounded in the style of a lateral cylinder surface by a suppressor electrode 341, the suppressor electrode 341 serving to suppress a lateral emergence of the electrons from the tip. By way of example, the tip 340 can be a thermal field emitter that is operated with a heating current intensity of a few ampere. A voltage of a few hundred volts relative to the tip 340 is applied to the suppressor 341. A voltage of several kilovolt relative to the tip 340 is applied to the extractor electrode 342 that is arranged at a distance from the tip 340. In this case, the distance between tip 340 and extractor 342 typically is a few hundred micrometers, for example 200 μm or 400 μm. The anode 343 is typically arranged just under one centimetre below the tip 340. The acceleration potential between tip 340 and anode 343 is several ten thousand kilovolt, for example 25 kV, 30 kV or 35 kV. To this point, the beam generating system 301 corresponds to an already known beam generating system. However, the arrangement of the electrostatic control electrode 344 between the extractor 342 and the anode 343 is new. There are a few millimetres, e.g., 6 mm, 8 mm or 10 mm, of space between these two elements, which is sufficient for spatially arranging a further electrode between the extractor 342 and the anode 343. In the simplest case, the electrostatic control lens 344 can be provided as a simple plate, to which an appropriate voltage is applied. The lens effect is then developed in conjunction with the neighbouring electrostatic fields.

In the example shown in FIG. 7, only the condenser lens 303.1 of the condenser lens system 303 is energized and the second condenser lens 203.2 is deactivated; however, this could also be different. In the example shown, the illuminating particle beam 311 strikes the multi-aperture array 313 telecentrically. There can now be fast or high-frequency driving of the electrostatic control lens 344, as a result of which there is a small variation in the beam spot diameter upon incidence on the multi-aperture array 313. FIG. 7 illustrates two different beam paths of the divergent particle beam 309 or of the illuminating particle beam 311. In the first case, the illumination spot that is formed upon incidence on the multi-aperture array 313 has a diameter d1 while it has a diameter d2 in the second case, where it is consequently expanded to slightly greater extent.

In this case, the idea of changing the diameter of the illumination spot is the same as already described further above in the context of FIGS. 2-6B, but the mechanism used to change the size of the illumination spot are different. In this case, the electrostatic fast control lens 344 is used instead of the conventional approach. In this case, the electrostatic control lens 344 can be positively or negatively biased in order thus to realize particularly fast voltage changes. By way of example, it can be at a potential between the potential of the anode 343 and that of the extractor 342, the range limits also being comprised. The specific potential can be chosen on the basis of the geometries of the electrodes.

By way of example, if measurements are now carried out on the upper side of the multi-aperture array 313 using a first beam current measuring mechanism such as, for example, a sensor system according to FIGS. 5A-6B of the beam current, an appropriate control signal can be generated via the controller 10 of the multi-beam particle microscope 1 on the basis of this measurement in order to excite the electrostatic control lens 344 for closed-loop beam current control, for example to apply a certain voltage to the latter. This feedback loop is very fast and a constant illumination of the micro-optics or the multi-aperture array 313 during running operation of the multi-beam particle microscope 1 can be obtained in this way.

In particular, even a high-frequency component of a beam current deviation during an image recording procedure using the multi-beam particle microscope 1 can be controlled via the electrostatic control lens 344. In this case, high-frequency closed-loop control is implemented in the beam generating system 301, but it is not necessary to adapt the acceleration voltage overall or change the extractor voltage. This ensures a largely constant operation of the tip 340 which need not be burnt in again—unlike in the case of a change in the extractor voltage.

Figure 8:
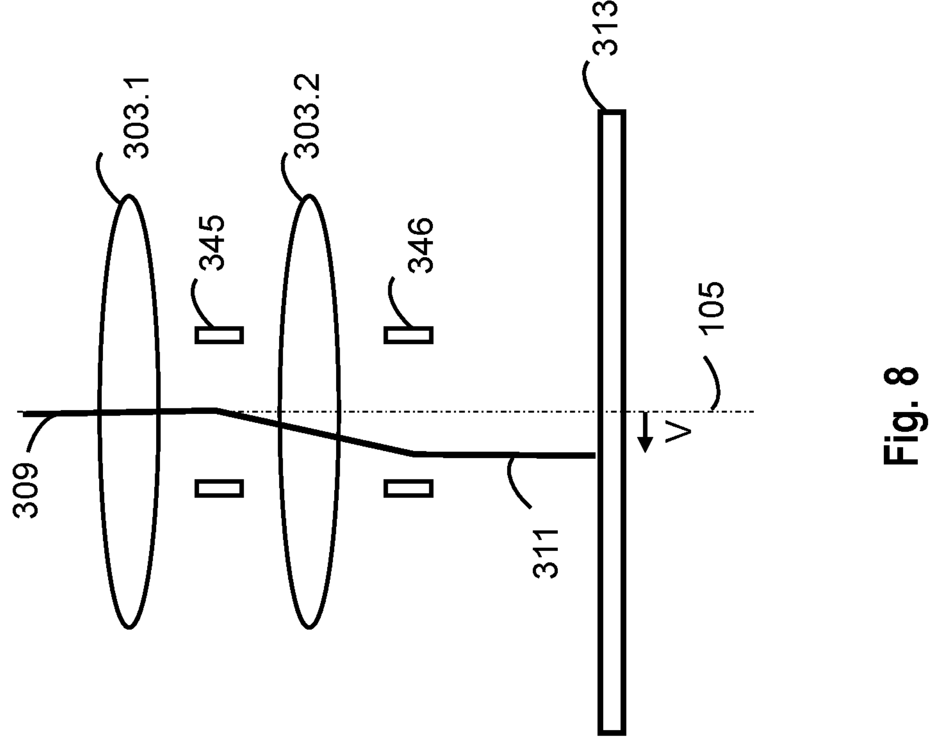
FIG. 8: shows a schematic representation of an electrostatic double deflector in the region of a condenser lens system, the electrostatic double deflector being suitable for high-frequency correction of a beam offset.

FIG. 8 illustrates further design options for a closed-loop beam current control mechanism. FIG. 8 depicts a ray of the divergent particle beam 309, which runs along the optical axis 105 and was generated via the beam generating system 301. It passes through the condenser lens system 303 having the first condenser lens 303.1 and the second condenser lens 303.2. Each one is a magnetic lens in the depicted example. An electrostatic double deflector with constituent parts 345 and 346 is arranged in the region of the condenser lens system 303. In relation to the particle optical beam path, the constituent part 345 is downstream of the first condenser lens 303.1 and the constituent part 346 is downstream of the second condenser lens 303.2 in the example shown. However, other arrangements of the double deflector in the region of the condenser lens system 303 are possible; by way of example, both constituent parts 345, 346 can be arranged downstream of the second condenser lens 303.2 in relation to the particle optical beam path.

The beam 311 can be offset in parallel by way of the double deflector. Upon incidence on the multi-aperture plate 313, the beam 311 is offset in relation to the optical axis 105 by the vector V. In this case, the electrostatic double deflector 345, 346 can be driven quickly and it is suitable for a high-frequency correction of an offset when the multi-aperture array 313 is illuminated. In turn, the double deflector 345, 346 can be driven on the basis of current values measured via a first beam current measuring mechanism, for example measured via the sensors 370 on the surface of the multi-aperture plate 313. This feedback loop can also be used for fast closed-loop current control during an image recording procedure.

Moreover, it is possible to form one of the condenser lenses 303 as an electrostatic condenser lens 303. This electrostatic condenser lens 303 can also be driven quickly and quasi instantaneously, in order to vary the diameter d of the illumination spot upon incidence on the multi-aperture plate 313 as a result. Once again, driving can be implemented in the form of a feedback loop based on current measurements which, in turn, have been determined for example via sensors 370 on the upper side of the multi-aperture array 313.

Figure 9:
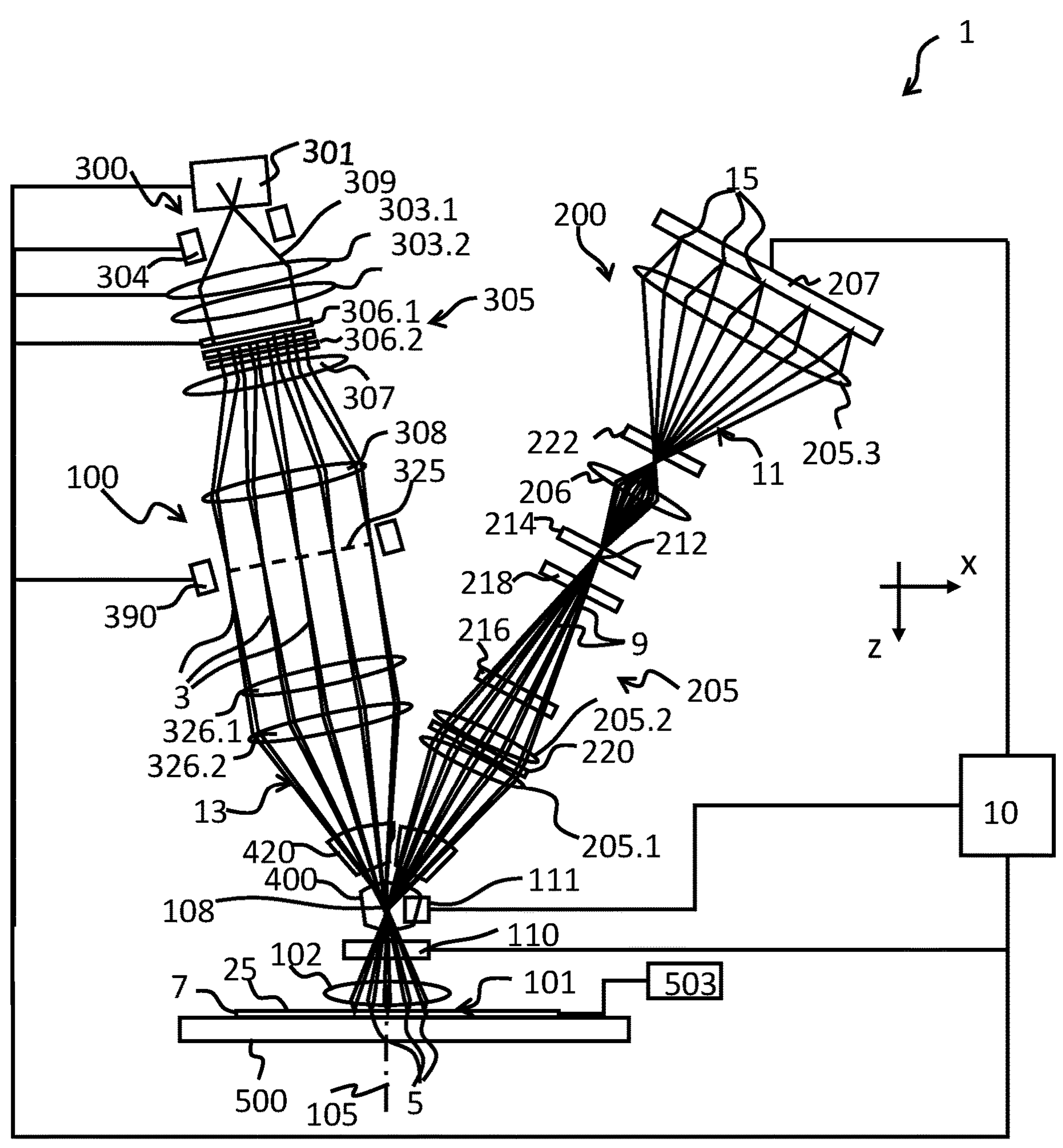
FIG. 9: schematically shows a multi-beam particle microscope having a closed-loop beam current control mechanism and compensators that are driven via a controller.

FIG. 9 schematically shows a multi-beam particle microscope 1 having a closed-loop beam current control mechanism and compensators that are driven via a controller 10. In this case, the controller 10 can be formed in one part or in many parts, the entire multi-beam particle microscope 1 being able to be controlled via the controller 10. In particular, the controller 10 controls the beam generating system 301, the components of the first particle optical unit, of the second particle optical unit, of the detection system 200 and further components of the multi-beam particle microscope 1, which may or may not be explicitly depicted. In the schematic representation of FIG. 9, certain control elements and aspects in the context of the present disclosure are represented by connecting lines to selected particle optical components. In particular, the multi-beam particle microscope 1 is suitable for carrying out the method according to the disclosure for operating a multi-beam particle microscope 1 in the embodiment variants described.

Initially, the beam current is measured via various beam current measuring mechanisms and the measured values are transmitted to the controller 10. In the example shown, a first beam current measuring mechanism is arranged on the upper side of the micro-optics and, in particular, on the upper side of a multi-aperture array 313. In this case, this could be one or more sensors 370, for example as illustrated in FIGS. 5A-6B. Additionally, an overall beam current is measured in the example shown via a sensor system arranged on or assigned to a beam stop 111. In this case, a multi-beam deflector 390 is used to steer the individual particle beams 3 onto the beam stop 111, which is arranged upstream of the objective lens 102 and level with a cross-over plane in the first particle optical beam path. In particular, the controller 10 can be configured to direct the first individual particle beams 3 into the beam stop 111 during a line jump or during an image jump when scanning over a sample surface. Thus, the overall beam current can be measured during an image recording procedure. The measured beam current value is transmitted to the controller 10 in turn. A deviation from a previously defined nominal beam current is determined from the measured values of the beam current. This deviation is decomposed into a drift component and into a high-frequency component via an algorithm which is implemented in the controller 10. Both the drift component of the beam current and the high-frequency component of the beam current can now be controlled or otherwise compensated via the closed-loop beam current control mechanism.

The components of the multi-beam particle microscope 1 are driven in a manner known per se for a static setting of the beam current or for a drift correction. This includes adjusting the extractor voltage in the beam generating system 301 and also driving the condenser lens system 303. The deflector 304 which is additionally depicted in FIG. 9 serves for static adjustment of the illuminating beam 311 upon incidence on the micro-optics 306. However, the multi-beam particle microscope 1 comprises further components and control elements for high-frequency driving for the purposes of controlling the beam current:

An electrostatic control electrode 344 (not depicted in FIG. 9) which is driven by the controller 10 by way of a feedback loop is provided as a constituent part of the beam generating system 301. Additionally or as an alternative, a condenser lens of the condenser lens system 303 can be designed as a fast electrostatic condenser lens and likewise be driven quickly. As a result, it is possible to quickly correct the diameter of the beam incident on the micro-optics 306.

For a fast correction of a lateral offset of the illumination spot, one or more electrostatic deflectors, in particular an electrostatic double deflector as depicted in FIG. 8 for example, may be additionally or alternatively provided in the condenser lens system 303. These deflectors can likewise be driven by way of a feedback signal based on measured current values.

In addition or as an alternative to the fast closed-loop beam current control as described above, further control loops are implemented in the multi-beam particle microscope 1 depicted in FIG. 9: By way of example, the scanning speed of the scan deflector 110 can be adapted on the basis of the measured beam current. By way of example, on the basis of the currently measured beam current values, it is possible to deviate from the nominal scanning speed by up to approximately 10% or up to approximately 5% or up to approximately 1%. Increasing the scanning speed reduces the beam current incident in a certain region/pixel on the sample while lowering the scanning speed increases the beam current incident there.

In addition or as an alternative, it is also possible to drive the detection system 200 on the basis of a measured beam current, the controller 10 being used for high-frequency adjustment of a gain and/or an offset of the detection system 200. In this case, the detection system 200 can be adjusted globally for all detection regions or channels or individually for individual channels/detection regions of individual secondary particle beams 9. In respect of further details, reference is made to the explanations above given in relation to the description of the disclosure (general part and figures part).

Figure 10:
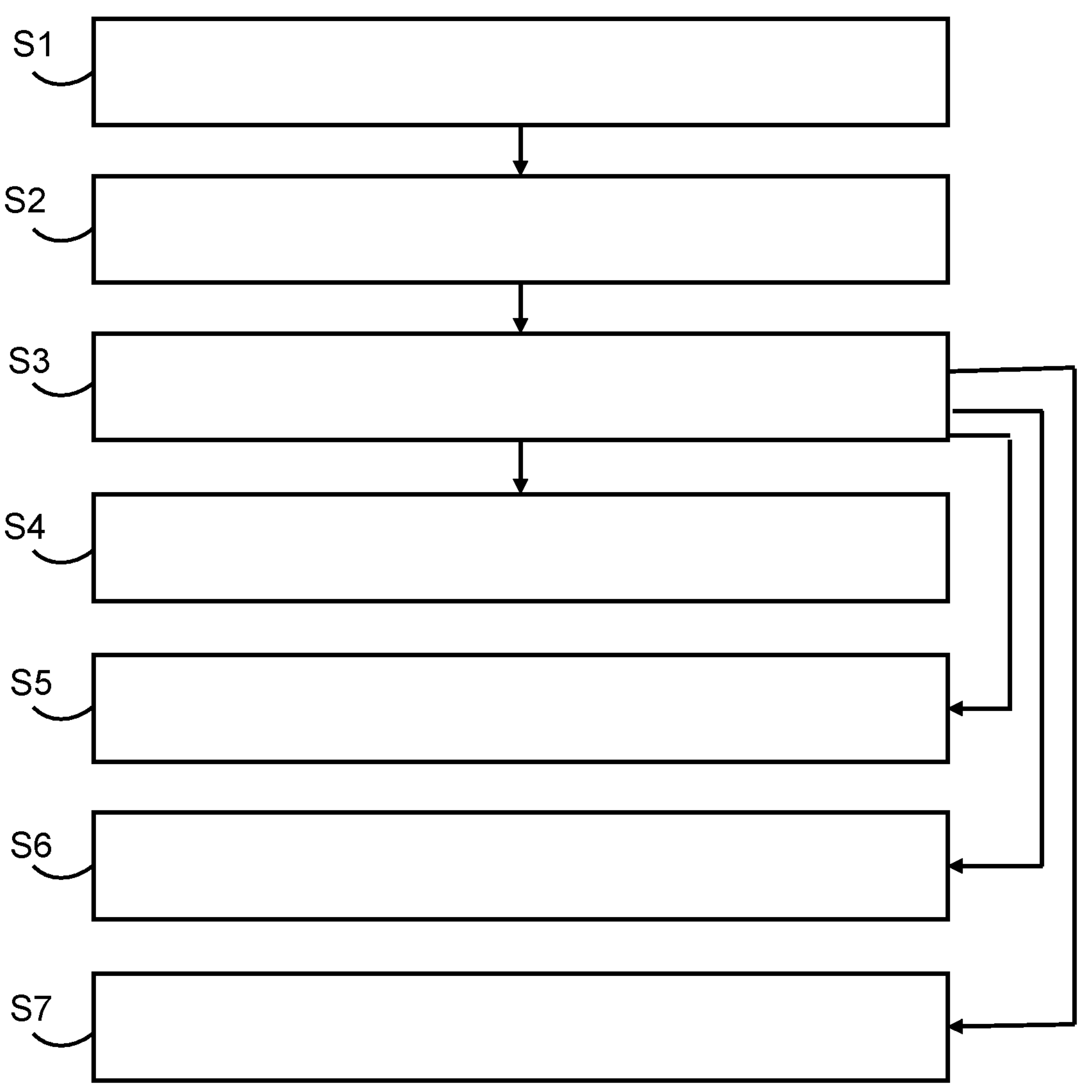
FIG. 10: schematically shows a flowchart of the method according to the disclosure for operating a multi-beam particle microscope.

FIG. 10 schematically shows, once again, a flowchart of the method according to the disclosure for operating a multi-beam particle microscope 1. The beam current is measured in a method step S1. In this case, the current beam current can be determined for predefined regions or individual particle beams 3, e.g., at the surface of a multi-aperture array 313, and/or which can be collectively determined for all individual particle beams 3, for example via a common beam stop 111 including a sensor system.

A deviation of the measured beam current from a nominal beam current is determined in a further method step S2. By way of example, the nominal beam current can be a minimum beam current but an interval of an admissible beam current may also be provided and demands in respect of a uniformity of various beam currents can also be made when defining a nominal beam current.

In a further method step S3, the determined deviation is decomposed into a drift component and a high-frequency component. A drift component of the beam current normally changes continuously over time, and hence over a relatively long period of time, for example over several days, weeks or even months. By contrast, the high-frequency component changes comparatively quickly, within seconds, minutes or hours, and for example during an ongoing measurement/image recording using the multi-beam particle microscope 1. The high-frequency changes in the beam current—in comparison with the drift component—occur comparatively quickly; by way of example, they are faster than the low-frequency changes on account of drift at least by the factor of 500 or 1000 or even 10000.

The high-frequency component of the beam current is controlled via a first closed-loop beam current control mechanism in a further method step S4. A plurality of embodiments of such high-frequency closed-loop control have already been described in conjunction with FIG. 9. By way of example, electrostatic control lens 344 of the beam generating system 301 can be used as closed-loop control element. Fast driving of an electrostatic condenser lens 303 is also possible. A lateral offset can be compensated quasi instantaneously via a fast electrostatic deflector, in particular an electrostatic double deflector, in the condenser lens system 303.

Moreover, the drift component of the beam current can optionally be controlled via a second closed-loop beam current control mechanism in a method step S7. The second closed-loop beam current control mechanism can be identical to the first closed-loop beam current control mechanism but it is optionally not identical to the first closed-loop beam current control mechanism. By way of example, a magnetic condenser lens can be driven quasi statically in order to compensate the drift.

Further measures can be taken in order to compensate the effect of the high-frequency beam current change on the recording quality of the multi-beam particle microscope 1, in addition or as an alternative to the closed-loop beam current control and, in particular, in addition or as an alternative to the high-frequency beam current correction.

According to a method step S5, a detection system 200 of the multi-beam particle microscope 1 is driven on the basis of the deviation of the beam current from the nominal beam current, a high-frequency adjustment of a gain and/or an offset of the detection system 200 being carried out on the basis of the high-frequency deviation of the beam current from the nominal beam current. In this case, the detection system 205 can be adjusted globally for all detection channels or individually for individual detection channels of the secondary individual particle beams 9.

Additionally or as an alternative, a scanning speed at which the plurality of individual particle beams 3 scan the surface of a sample 7 can be adjusted in a method step S6. The beam current per pixel on the sample 7 can be reduced in a feedback loop by way of increasing a scanning speed while the beam current can be increased by reducing the scanning speed.

The method depicted in FIG. 10 can be a computer-implemented method and can thus be integrated in the computers or in the controller 10 of the multi-beam particle microscope 1.

LIST OF REFERENCE SIGNS

1 Multi-beam particle microscope
3 Primary particle beams (individual particle beams)
5 Beam spots, incidence locations
7 Object
9 Secondary particle beams
10 Computer system, controller
11 Secondary particle beam path
13 Primary particle beam path
25 Sample surface, wafer surface
100 Objective lens system
101 Object plane
102 Objective lens
103 Field
105 Optical axis of the multi-beam particle microscope
108 Cross-over
110 Collective scan deflector
111 Beam stop with a second current measuring mechanism
200 Detector system
205 Projection lens
207 Detection region
208 Deflector for adjustment purposes
209 Particle multi-detector
211 Detection plane
212 Cross-over
213 Incidence locations
214 Aperture filter
215 Detection region
216 Active element
217 Field
218 Deflector system
220 Multi-aperture corrector, individual deflector array
222 Collective deflection system, anti-scan
300 Beam generating apparatus
301 Particle source, beam generating system
303 Collimation lens system
304 Deflector
305 Multi-aperture arrangement
306 Micro-optics
307 Field lens
308 Field lens
309 Diverging particle beam
311 Illuminating particle beam
313 Multi-aperture plate, multi-aperture array
315 Openings in the multi-aperture plate
316 Hexagon
317 Midpoints of the openings
319 Field
323 Beam foci
325 Intermediate image plane
326 Field lens system
340 Tip
341 Suppressor
342 Extractor electrode
343 Anode
344 Electrostatic control electrode
345 Deflector
346 Deflector
351 Region
352 Region
353 Region
354 Region
360 Beam current intensity representation
370 First beam current measuring mechanism
390 Multi-beam deflector
400 Beam switch
420 Magnetic element
500 Sample stage
503 Voltage supply for the sample
d1 Beam cone diameter
d2 Beam cone diameter
r Beam cone radius
M Beam spot midpoint
P Multi-aperture plate midpoint, multi-aperture array midpoint
V Displacement between beam cone midpoint and multi-aperture array midpoint
S1 Measuring the beam current
S2 Determining a deviation of the beam current
S3 Carrying out a decomposition into drift and high-frequency component
S4 Controlling the high-frequency component
S5 Adjusting the detectors
S6 Adjusting the scanning speed
S7 Controlling the drift component

What is claimed is:

1. A method, comprising:

measuring a beam current of a plurality of individual charged particle beams generated by a multi-beam particle microscope;

determining a deviation of the measured beam current from a nominal beam current;

decomposing the determined deviation into a drift component and into a high-frequency component; and using a first closed-loop beam current control mechanism to control the high-frequency component of the beam current, and/or using a mechanism different from the closed-loop beam current control mechanism to compensate an effect of the high-frequency component on a recording quality of the multi-beam particle microscope.

2. The method of claim 1, comprising using a first closed-loop beam current control mechanism to control a high-frequency component of the beam current.

3. The method of claim 2, comprising using a mechanism different from the closed-loop beam current control mechanism to compensate an effect of the high-frequency component on a recording quality of the multi-beam particle microscope.

4. The method of claim 1, comprising using a mechanism different from a closed-loop beam current control mechanism to compensate an effect of the high-frequency component on a recording quality of the multi-beam particle microscope.

5. The method of claim 1, furthermore comprising controlling the drift component of the beam current via a second closed-loop beam current control mechanism.

6. The method of claim 1, wherein measuring the beam current comprises measuring an overall beam current of the individual particle beams during an image recording procedure.

7. The method of claim 1, wherein measuring the beam current comprises measuring a current at selected positions of a multi-aperture array during an image recording procedure.

8. The method of claim 7, further comprising determining a radius and/or a displacement of the beam cone incident on the multi-aperture array.

9. The method of claim 7, wherein three sensors are supported by an upper side of the multi-aperture array around the outside of the plurality of apertures.

10. The method of claim 7, comprising using the first closed-loop beam current control mechanism to adjust an illumination of the multi-aperture array in a high-frequency manner to control the high-frequency component of the beam current via the first closed-loop beam current control mechanism.

11. The method of claim 10, wherein:

the first closed-loop beam current control mechanism comprises an electrostatic double deflector in a region of a condenser lens system; and/or the first closed-loop beam current control mechanism comprises an electrostatic condenser lens.

12. The method of claim 10, wherein the first closed-loop beam current control mechanism comprises an electrostatic control lens between an extractor electrode and an anode of a beam generating system of the multi-beam particle microscope.

13. The method of claim 1, comprising using a mechanism different from the closed-loop beam current control mechanism to drive a detection system of the multi-beam particle microscope based on the high-frequency deviation of the beam current from the nominal beam current, wherein a high-frequency adjustment of a gain and/or an offset of the detection system is performed based on the high-frequency deviation of the beam current from the nominal beam current, thereby compensating an effect of the high-frequency component on a recording quality of the multi-beam particle microscope.

14. The method of claim 13, further comprising globally implementing the adjustment of the detection system globally for all channels or individually for individual channels of individual particle beams.

15. The method of claim 13, wherein compensating effects of the high-frequency component on the recording quality of the multi-beam particle microscope comprises adapting a scanning speed with which the plurality of individual particle beams scan over the surface of a sample.

16. The method of claim 1, furthermore comprising logging the measured beam current values.

17. The method of claim 16, furthermore including the following step:

estimating the residual service life of a tip of the beam generating system and/or initiating a required replacement of the tip.

18. One or more machine-readable hardware storage devices comprising instructions that are executable by one or more processing devices to perform operations comprising the method of claim 1.

19. A system, comprising:

one or more processing devices; and one or more machine-readable hardware storage devices comprising instructions that are executable by one or more processing devices to perform operations comprising the method of claim 1.

20. A multi-beam particle microscope, comprising the following:

a beam generating system, comprising:

a particle source;

an extractor electrode;

an anode, wherein the particle source, the extractor electrode and the anode are configured to produce a first charged particle beam; and an electrostatic control lens between the extractor electrode and the anode;

a multi-beam generator comprising a multi-aperture array, the multi-beam generator being configured to produce a first field of a plurality of first individual charged particle beams from the first charged particle beam;

a first beam current measuring mechanism at the multi-aperture array;

a first particle optical unit having a first particle optical beam path, the first particle optical unit configured to direct the first individual particle beams to a sample such that the first individual particle beams strike the sample at incidence locations to form a second field;

a detection system;

a second particle optical unit having a second particle optical beam path, the second particle optical unit being configured to image onto the detection system second individual particle beams emanating from the incidence locations in the second field;

a particle optical objective lens configured to have the first and the second individual particle beams pass therethrough;

a beam switch which is in: the first particle optical beam path between the multi-beam generator and the objective lens; and the second particle optical beam path between the objective lens and the detection system; and a controller configured to control the beam generating system, the particle optical objective lens, the first particle optical unit, the second particle optical unit, and the detection system, wherein the controller being is configured to drive the electrostatic control lens based on a current measurement determined by first beam current measuring mechanism.

21. A multi-beam particle microscope, comprising:

a beam generating system comprising a particle source, an extractor electrode and an anode and configured to produce a first charged particle beam, the beam generating system moreover comprising an electrostatic control lens arranged between the extractor electrode and the anode;

a multi-beam generator having a multi-aperture array, the multi-beam generator being configured to produce a first field of a plurality of first individual charged particle beams from the first charged particle beam;

a second beam current measuring mechanism, configured to measure an overall beam current of the individual particle beams;

a first particle optical unit with a first particle optical beam path, configured to direct the generated first individual particle beams at a sample such that the first individual particle beams strike the sample at incidence locations, which form a second field;

a detection system;

a second particle optical unit with a second particle optical beam path, which is configured to image second individual particle beams, which emanate from the incidence locations in the second field, onto the detection system;

a particle optical objective lens, through which both the first and the second individual particle beams pass;

a beam switch, which is arranged in the first particle optical beam path between the multi-beam generator and the objective lens and which is arranged in the second particle optical beam path between the objective lens and the detection system; and a controller which is configured to control the beam generating system, the particle optical objective lens, the first particle optical unit, the second particle optical unit, and the detection system, and with the controller being configured for driving, in particular high-frequency driving, of the electrostatic control lens on the basis of the current measurement via the second beam current measuring mechanism.

* * * * *